(12) United States Patent
Yuan

(10) Patent No.: US 11,035,913 B2
(45) Date of Patent: Jun. 15, 2021

(54) MAGNETIC FIELD SENSING DEVICE

(71) Applicant: Fu-Te Yuan, New Taipei (TW)

(72) Inventor: Fu-Te Yuan, New Taipei (TW)

(73) Assignee: iSentek Inc., New Taipei (TW)

( * ) Notice: Subject to any disclaimer, the term of this patent is extended or adjusted under 35 U.S.C. 154(b) by 15 days.

(21) Appl. No.: 16/519,010

(22) Filed: Jul. 23, 2019

(65) Prior Publication Data
US 2020/0057119 A1 Feb. 20, 2020

Related U.S. Application Data

(60) Provisional application No. 62/718,973, filed on Aug. 15, 2018.

(30) Foreign Application Priority Data

May 31, 2019 (TW) .................. 108118916

(51) Int. Cl.
*G01R 33/09* (2006.01)
(52) U.S. Cl.
CPC ......... *G01R 33/091* (2013.01); *G01R 33/093* (2013.01); *G01R 33/098* (2013.01)
(58) Field of Classification Search
CPC .............. G01R 33/0011; G01R 33/093; G01R 33/098; G01R 15/185; G01R 15/205; G01R 17/10; G01R 17/105; G01R 33/0005; G01R 33/0023; G01R 33/0094; G01R 33/09; G01R 33/091
See application file for complete search history.

(56) References Cited

U.S. PATENT DOCUMENTS 8,508,221 B2 8/2013 Sun et al.
2015/0108974 A1* 4/2015 Kennedy .............. G01R 33/098
324/252

(Continued)

FOREIGN PATENT DOCUMENTS

CN 104678331 6/2015
TW 201337303 9/2013
TW 201520575 6/2015

OTHER PUBLICATIONS

Topologically Protected Vortex Structures to Realize Low-Noise Magnetic Sensors, Mesoscale and Nanoscale Physics, Dieter Suess et al, Dec. 19, 2017, arXiv: 1712.07061 (Year: 2017).*

*Primary Examiner* — Huy Q Phan
*Assistant Examiner* — Adam S Clarke
(74) *Attorney, Agent, or Firm* — JCIPRNET

(57) ABSTRACT

A magnetic field sensing device including a magnetic flux concentrating module and a plurality of vortex magnetoresistors is provided. The magnetic flux concentrating module has a first side, a second side, a third side and a fourth side, wherein the first side is parallel to the third side, the second side is parallel to the fourth side, and the first side is not parallel to the second side. The vortex magnetoresistors are disposed beside the first to the fourth sides. The vortex magnetoresistors have a same pinning direction. The pinning direction is inclined with respect to the first side and the second side. The vortex magnetoresistors are configured to be connected to form a plurality of different Wheatstone bridges, so as to sense magnetic field components in a plurality of different directions, respectively.

13 Claims, 14 Drawing Sheets

(56) References Cited

U.S. PATENT DOCUMENTS

2015/0137804 A1* 5/2015 Yuan ................. G01R 33/0011
                                                                            324/244
2017/0108559 A1* 4/2017 Yuan ................... G01R 33/098
2018/0164387 A1* 6/2018 Raberg ................ G01R 33/098

* cited by examiner

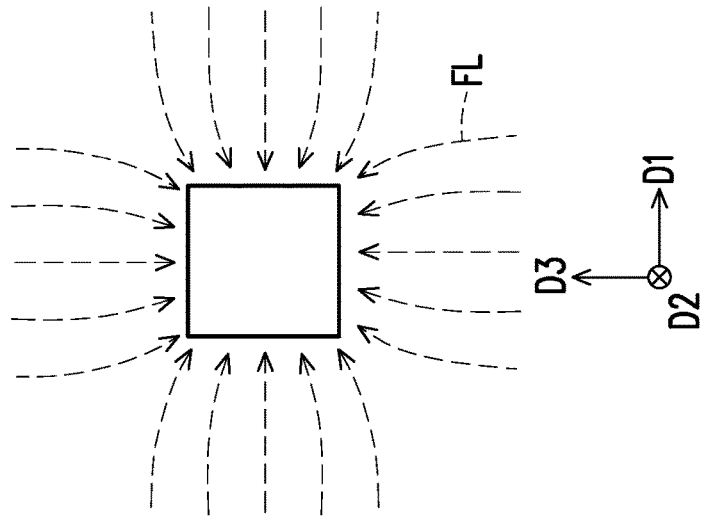
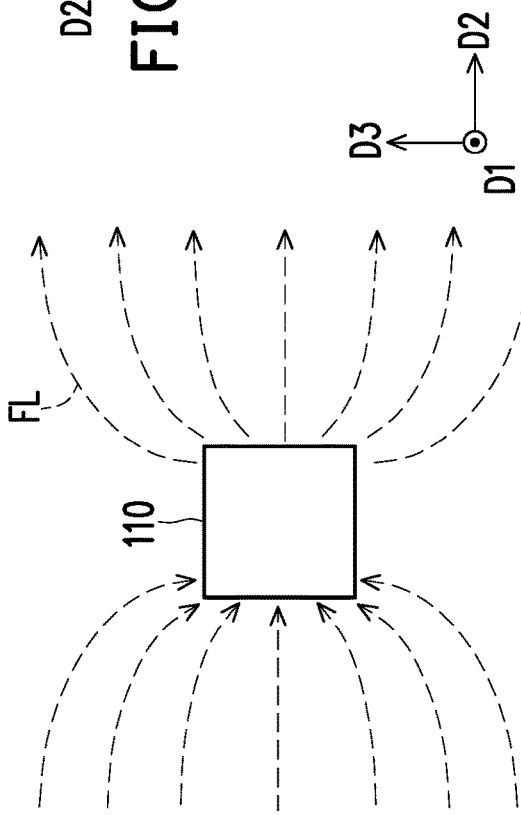
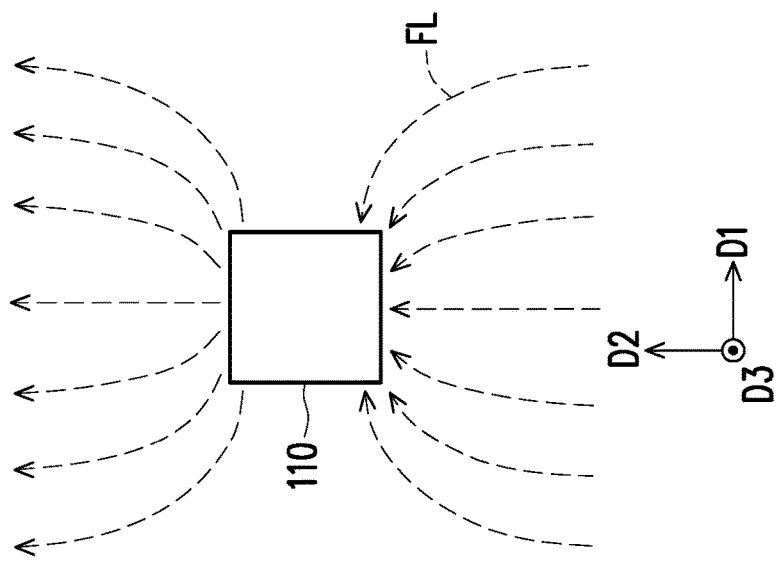
FIG. 7A
FIG. 7B
FIG. 7C

MAGNETIC FIELD SENSING DEVICE

CROSS-REFERENCE TO RELATED APPLICATION

This application claims the priority benefits of U.S. provisional application Ser. No. 62/718,973, filed on Aug. 15, 2018, and Taiwan application serial no. 108118916, filed on May 31, 2019. The entirety of each of the above-mentioned patent applications is hereby incorporated by reference herein and made a part of this specification.

BACKGROUND

Field of the Invention

The invention relates to a magnetic field sensing device.

Description of Related Art

A magnetic field sensor is an important component capable of providing a system with an electronic compass and a motion tracking function. In recent years, related applications thereof are rapidly developed, particularly those for portable devices. In new generation of applications, high accuracy, quick response, a small volume, low power consumption and reliable quality have become essential features of the magnetic field sensor.

A conventional giant magnetoresistor or a tunneling magnetoresistor has a structure formed by sequentially stacking a pinning layer, a pinned layer, a spacer layer and a free layer, wherein the free layer has a magnetic easy-axis which is perpendicular to a pinning direction of the pinning layer. To construct a single-axis magnetic sensor having Wheatstone bridges, magnetoresistors having different pinning directions are essential. For a three-axes magnetic sensor, it requires a plurality of magnetoresistors respectively having six pinning directions. However, from a point of view of manufacturing, manufacturing a second pinning direction for the pinning layer in a wafer may cause considerable increase in the cost and result in reduction in stability of configuring a magnetization direction in the pinned layer.

SUMMARY

The invention provides a magnetic field sensing device capable of using a plurality of vortex magnetoresistors having a same pinning direction to achieve sensing magnetic field components in a plurality of different directions.

A magnetic field sensing device provided by an embodiment of the invention includes a magnetic flux concentrating module and a plurality of vortex magnetoresistors. The magnetic flux concentrating module has a first side, a second side, a third side and a fourth side, wherein the first side is parallel to the third side, the second side is parallel to the fourth side, and the first side is not parallel to the second side. The vortex magnetoresistors are disposed beside the first to the fourth sides. The vortex magnetoresistors have a same pinning direction. The pinning direction is inclined with respect to the first side and the second side. The vortex magnetoresistors are configured to be connected to form a plurality of different Wheatstone bridges, so as to sense magnetic field components in a plurality of different directions, respectively.

In the magnetic field sensing device provided by the embodiment of the invention, the direction of the magnetic field is changed by using the magnetic flux concentrating module, and the pinning direction of the vortex magnetoresistors is inclined with respect to the sides of the magnetic flux concentrating module. Thus, the sensing of the magnetic field components in different directions can be achieved by using the vortex magnetoresistors having the same pinning direction. In this way, the magnetic field sensing device provided by the embodiment of the invention has a simple and stable manufacturing process and lower manufacturing cost, and thereby, a magnetization state of the vortex magnetoresistors can be more stable.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7A, FIG. 7B and FIG. 7C respectively illustrate deflection states of the magnetic flux lines in three different view angles when an external magnetic field along the second direction passes through near the magnetic flux concentrating module.

DESCRIPTION OF EMBODIMENTS

Figure 1A:
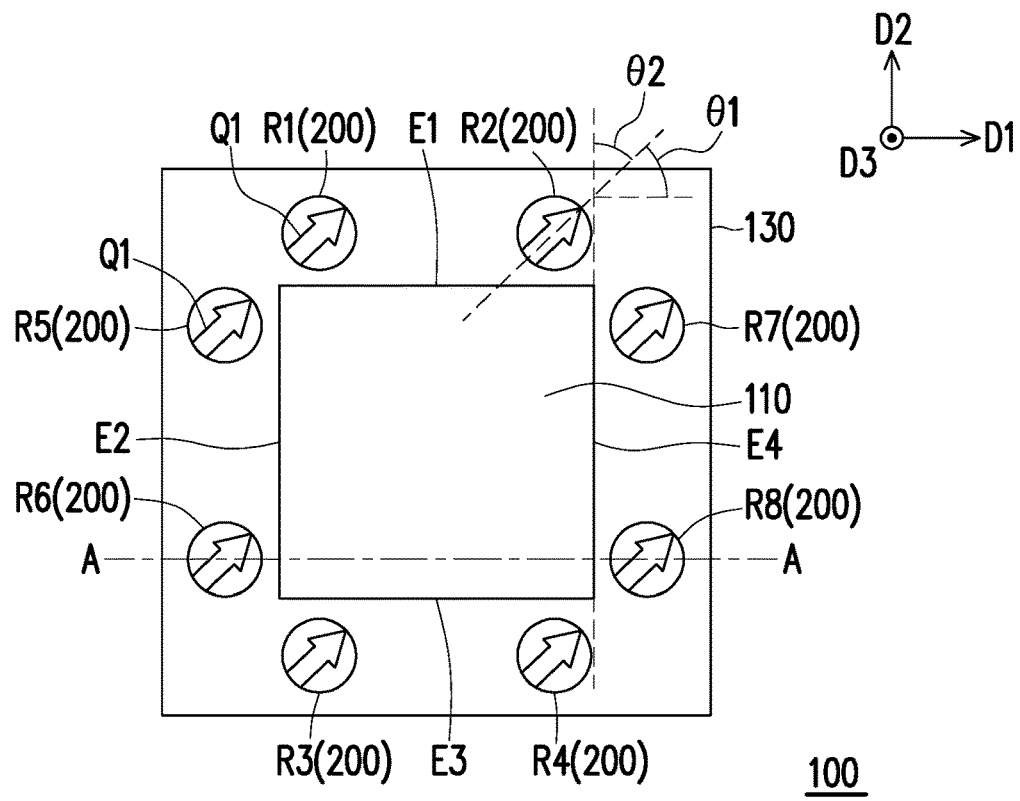
FIG. 1A is a schematic top-view diagram illustrating a magnetic field sensing device according to an embodiment of the invention.
Figure 1B:
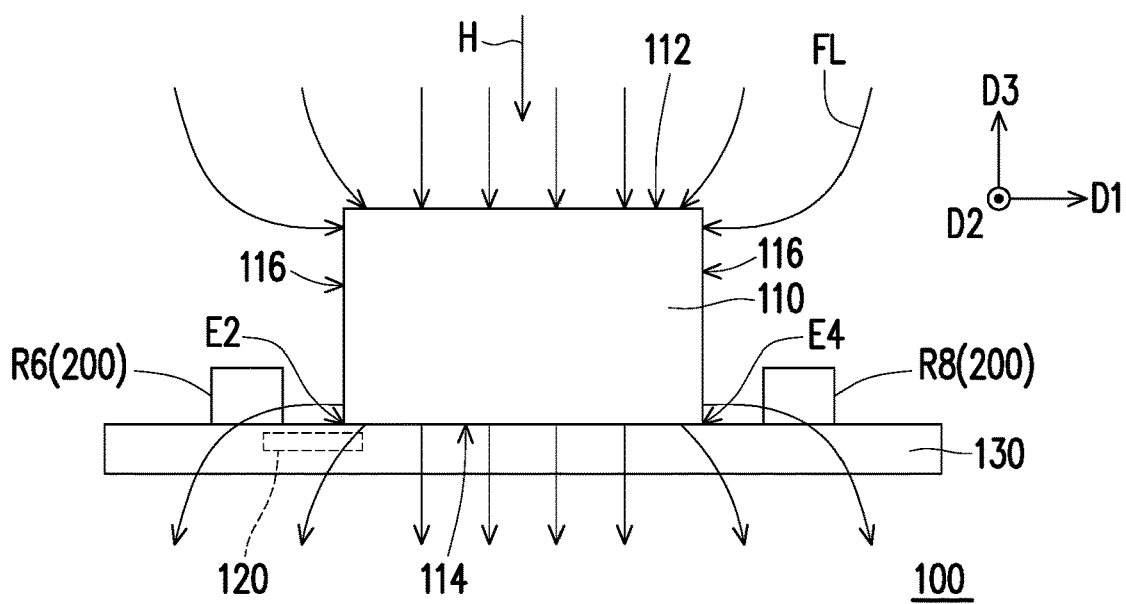
FIG. 1B is a schematic cross-sectional diagram illustrating the magnetic field sensing device depicted in FIG. 1A along line A-A'.

FIG. 1A is a schematic top-view diagram illustrating a magnetic field sensing device according to an embodiment of the invention. FIG. 1B is a schematic cross-sectional diagram illustrating the magnetic field sensing device depicted in FIG. 1A along line A-A'. Referring to FIG. 1A and FIG. 1B, a magnetic field sensing device 100 of the present embodiment includes a magnetic flux concentrating module 110 and a plurality of vortex magnetoresistors 200. The magnetic flux concentrating module 110 has a first side E1, a second side E2, a third side E3 and a fourth side E4, wherein the first side E1 is parallel to the third side E3, the second side E2 is parallel to the fourth side E4, and the first side E1 is not parallel to the second side E2. In the present embodiment, the first side E1 is perpendicular to the second side E2. Additionally, in the present embodiment, the magnetic flux concentrating module 110 is a single magnetic flux concentrator, and the first, the second, the third and the fourth sides E1, E2, E3 and E4 are four sides of this magnetic flux concentrator. However, in other embodiments, the magnetic flux concentrating module 110 may include a plurality of magnetic flux concentrators.

In the present embodiment, a shape of the magnetic flux concentrator is a polyhedron, for example, a cube or a quadrangular column, wherein the quadrangular column has a part of surfaces being rectangular shapes while another part of the surfaces being square shapes, or alternatively, all the surfaces of the quadrangular column are being rectangular shapes. In the present embodiment, the magnetic flux concentrating module 110 includes a top surface 112, a bottom surface 114 opposite to the top surface 112 and four side surfaces 116 connecting the top surface 112 and the bottom surface 114, wherein the first, the second, the third and the fourth sides E1, E2, E3 and E4 are respectively four sides of the four side surfaces 116 in contact with the bottom surface 114. In the present embodiment, a space where the magnetic field sensing device 100 is located may be constituted by a first direction D1, a second direction D2 and a third direction D3, wherein the first direction D1, the second direction D2 and the third direction D3 may be perpendicular to one another. In the present embodiment, the first direction D1 is parallel to the first side E1 and the third side E3, the second direction D2 is parallel to the second side E2 and the fourth side E4, the third direction D3 is perpendicular to the bottom surface 114 and the top surface 112, i.e., perpendicular to a plane, and the first, the second, the third and the fourth sides E1, E2, E3 and E4 fall in this plane.

In the present embodiment, a material of the magnetic flux concentrator includes a ferromagnetic material with a magnetic permeability greater than 10. In addition, a residual magnetism of the magnetic flux concentrator is, for example, less than 10% of a saturated magnetization thereof. For example, the magnetic flux concentrator is made of a soft magnetic material, such as nickel-iron alloy, ferrocobalt or cobalt-iron-boron alloy, ferrite or other high magnetic permeability materials.

The vortex magnetoresistors 200 are disposed beside the first to the fourth sides E1, E2, E3 and E4, wherein the vortex magnetoresistors 200 have a same pinning direction Q1. The pinning direction Q1 is inclined with respect to the first side E1 and the second side E2. The vortex magnetoresistors 200 are configured to be connected to form a plurality of different Wheatstone bridges, so as to sense magnetic field components in a plurality of different directions, respectively.

Figure 2:
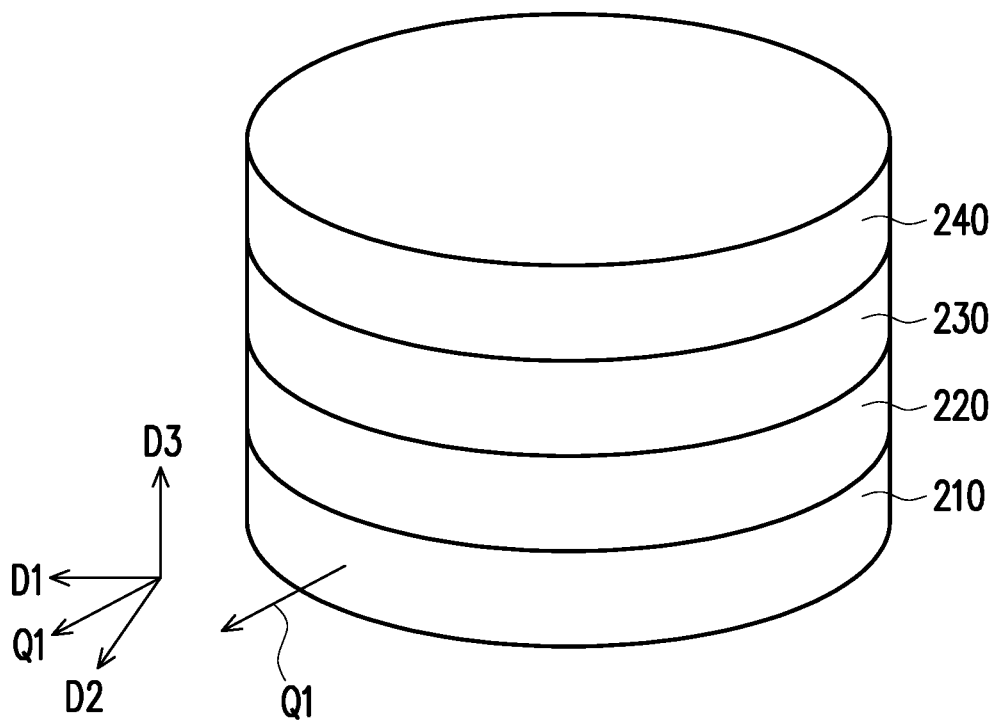
FIG. 2 is a schematic perspective diagram illustrating one of the vortex magnetoresistors depicted in FIG. 1A.
Figure 3:
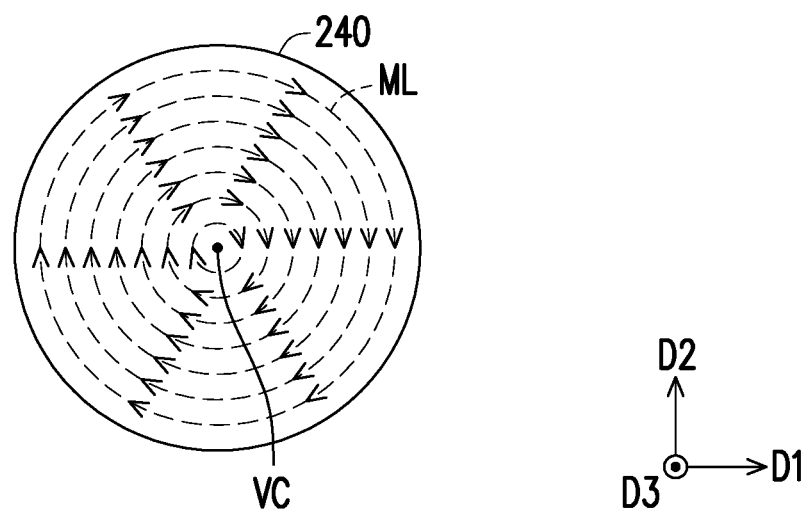
FIG. 3 is a schematic top-view diagram illustrating one of the vortex magnetoresistors depicted in FIG. 1A.

FIG. 2 is a schematic perspective diagram illustrating one of the vortex magnetoresistors depicted in FIG. 1A. FIG. 3 is a schematic top-view diagram illustrating the vortex magnetoresistor depicted in FIG. 1A. FIG. 4A through FIG. 4D respectively illustrate four variations in distributions of magnetization directions generated to a round free layer depicted in FIG. 2 by an external magnetic field in four different directions. FIG. 5 illustrates a variation of a resistance value of the vortex magnetoresistor depicted in FIG. 3 with the external magnetic fields in different directions and without the external magnetic field.

In the present embodiment, the vortex magnetoresistor 200 includes a pinning layer 210, a pinned layer 220, a spacer layer 230 and a round free layer 240. The pinned layer 220 is disposed on the pinning layer 210, the spacer layer 230 is disposed on the pinned layer 220, and the round free layer 240 is disposed on the spacer layer 230. In the present embodiment, the pinning layer 210 provides a pinning direction P1, thereby fixing a magnetization direction of the pinned layer 220 to the pinning direction Q1. In the present embodiment, the pinning layer 210 is made of an antiferromagnetic material, and the pinned layer 220 and the round free layer 240 are made of ferromagnetic materials, wherein the round free layer 240 is made of a soft magnetic material.

In the present embodiment, the pinning direction Q1 is inclined with respect to the first side E1, inclined with respect to the second side E2 and parallel to a plane constituted by the first direction D1 and the second direction D2. Namely, the pinning direction Q1 is parallel to a plane constituted by the first side E1 and the second side E2. In the present embodiment, an included angle θ1 between the pinning direction Q1 and the first side E1 falls within a range from 10 degrees to 80 degrees, and an included angle θ2 between the pinning direction Q1 and the second side E2 falls within a range from 10 degrees to 80 degrees. In FIG. 1A, a condition that θ1=θ2=45 degrees is taken as an example. Additionally, in the present embodiment, each of the layers, including the pinning layer 210, the pinned layer 220, the spacer layer 230 and the round free layer 240, is parallel to the plane constituted by the first direction D1 and the second direction D2.

The round free layer 240 has a magnetization direction distribution in a vortex shape. Specifically, when no external magnetic field exists, a magnetization direction ML of the round free layer 240 is arranged in a plurality of round shapes along a round contour of the round free layer 240, and diameters of these round shapes are gradually reduced and finally converged to the center of the round contour. The magnetization direction ML may be arranged in a clockwise direction or in a counterclockwise direction. A vortex core VC is formed in the center of the round free layer 240, and the magnetization direction of the vortex core VC is perpendicular to the round free layer 240, which may face up (i.e., in the third direction D3 illustrated in FIG. 2 and FIG. 3) or face down (i.e., in a direction opposite to the third direction D3 illustrated in FIG. 2 and FIG. 3). In this circumstance, a net magnetization of the entire round free layer 240 is zero.

In the present embodiment, the vortex magnetoresistor 200 may be a giant magnetoresistor (GMR) or a tunneling magnetoresistor (TMR). When the vortex magnetoresistor 200 is a GMR, the spacer layer 230 is a non-magnetic metal layer. When the vortex magnetoresistor 200 is a TMR, the spacer layer 230 is an insulation layer.

In the present embodiment, the magnetic field sensing device 100 further includes a substrate 130, wherein the magnetic flux concentrating module 110 and the vortex magnetoresistors 200 are all disposed on the substrate 130. In the present embodiment, the pinning layer 210 is disposed on the substrate 130. Additionally, in the present embodiment, the substrate 130 is a circuit substrate, for example, a semiconductor substrate having a circuit.

Figure 4A:
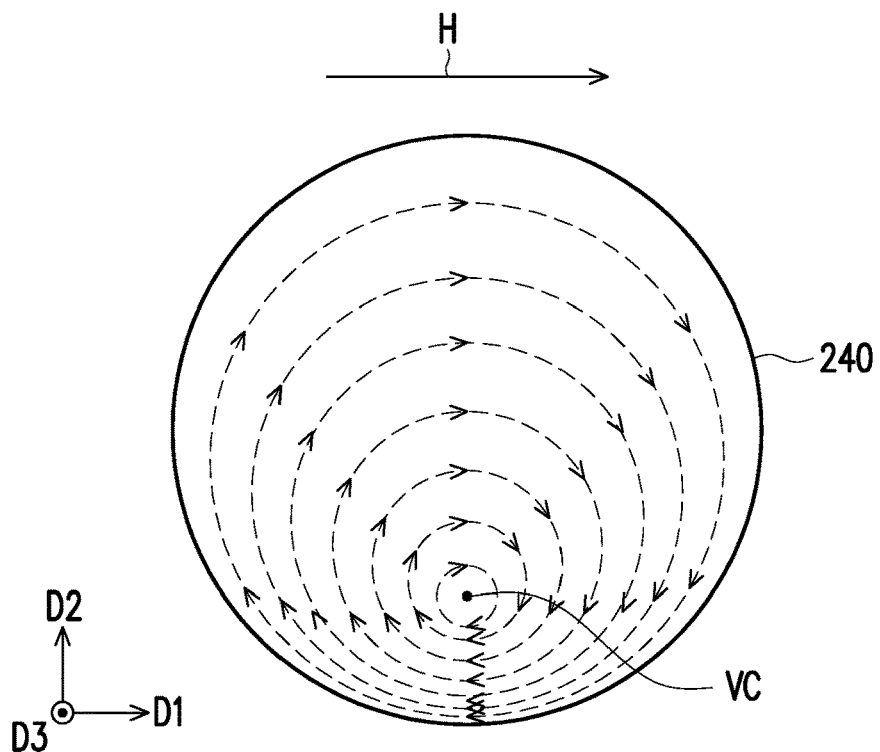
FIG. 4A through FIG. 4D respectively illustrate four variations in distributions of magnetization directions generated to a round free layer depicted in FIG. 2 by an external magnetic field in four different directions.
Figure 5:
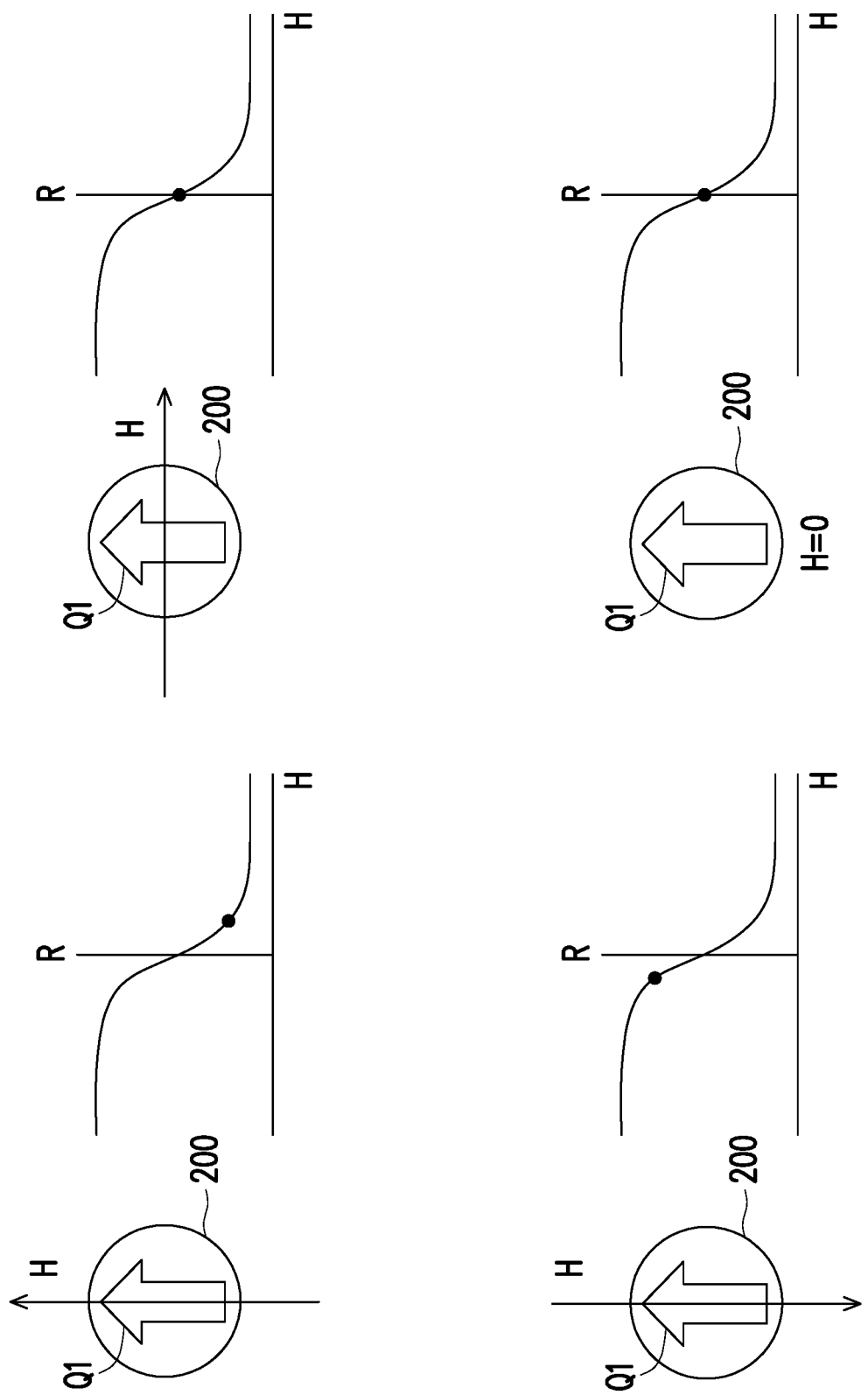
FIG. 5 illustrates a variation of a resistance value of the vortex magnetoresistor depicted in FIG. 3 with the external magnetic fields in different directions and without the external magnetic field.

Referring to FIG. 4A, when an external magnetic field H along the first direction D1 passes through the vortex magnetoresistor 200, an area on a side of the vortex core VC which is oriented to the second direction D2 is increased, an area on a side of the vortex core VC which is oriented to a direction opposite to the second direction D2 is decreased, and the magnetization directions in the areas on the two sides are opposite to each other, which causes the entire round free layer 240 to generate a net magnetization oriented to the first direction D1 and causes the vortex core VC to move in the direction opposite to the second direction D2.

Figure 4B:
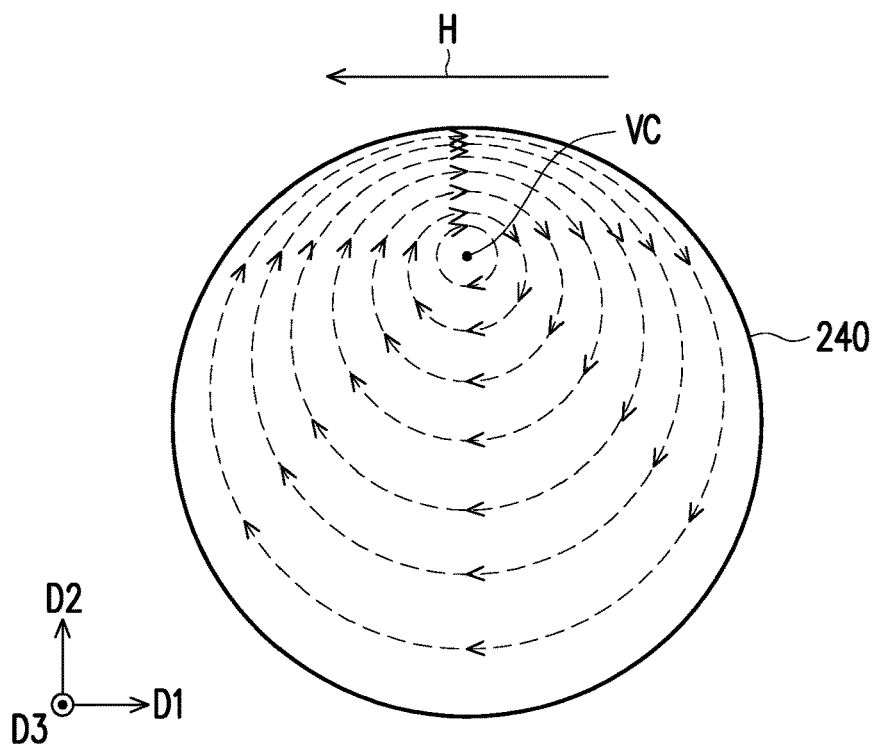

Referring to FIG. 4B, when an external magnetic field H along a direction opposite to the first direction D1 passes through the vortex magnetoresistor 200, the area on the side of the vortex core VC which is oriented to the second direction D2 is decreased, the area on the side of the vortex core VC which is oriented to the direction opposite to the second direction D2 is increased, and the magnetization directions in the areas on the two sides are opposite to each other, which causes the entire round free layer 240 to generate a net magnetization oriented to the direction opposite to the first direction D1 and causes the vortex core VC to move in the second direction D2.

Figure 4C:
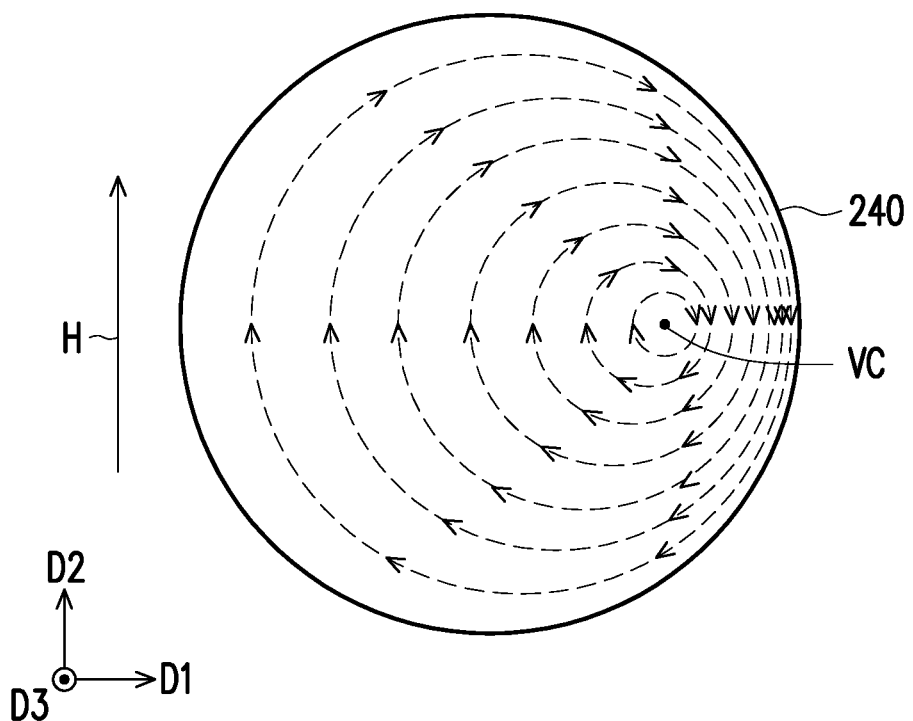

Referring to FIG. 4C, when an external magnetic field H along the second direction D2 passes through the vortex magnetoresistor 200, an area on a side of the vortex core VC which is oriented to the first direction D1 is decreased, an area on a side of the vortex core VC which is oriented to the direction opposite to the first direction D1 is increased, and the magnetization directions in the areas on the two sides are opposite to each other, which causes the entire round free layer 240 to generate a net magnetization oriented to the second direction D2 and causes the vortex core VC to move in the first direction D1.

Figure 4D:
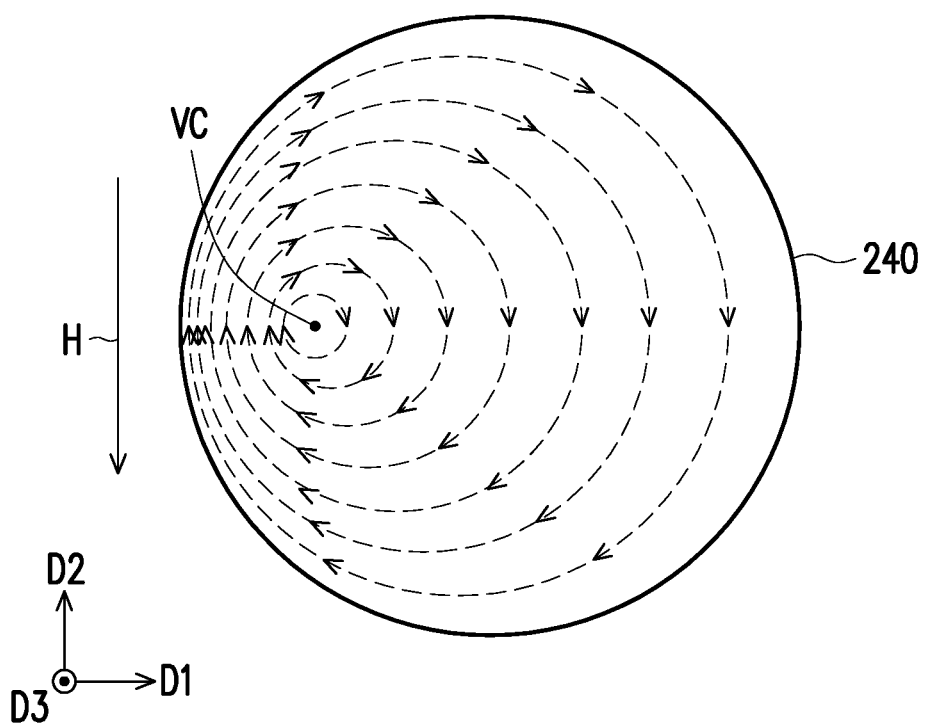

Referring to FIG. 4D, when an external magnetic field H along the direction opposite to the second direction D2 passes through the vortex magnetoresistor 200, the area on the side of the vortex core VC which is oriented to the first direction D1 is increased, the area on the side of the vortex core VC which is oriented to the direction opposite to the first direction D1 is decreased, and the magnetization directions in the areas on the two sides are opposite to each other, which causes the entire round free layer 240 to generate a net magnetization oriented to the direction opposite to the second direction D2 and causes the vortex core VC to move in the direction opposite to the first direction D1.

FIG. 5 illustrates a variation of a resistance value of the vortex magnetoresistor depicted in FIG. 3 with the external magnetic fields in different directions and without the external magnetic field. Referring to FIG. 2, FIG. 4A through FIG. 4 and FIG. 5, the curve graph illustrated in FIG. 5 demonstrates a variation of a resistance value R of the vortex magnetoresistor 200 with respect to the external magnetic field H. As illustrated in the upper left graph in FIG. 5, when the external magnetic field H in a direction the same as the pinning direction Q1 is applied to the vortex magnetoresistor 200, the round free layer 240 illustrated in FIG. 4C generates a net magnetization in the pinning direction Q1, which causes the resistance value R to decrease, i.e., the value of the resistance value R corresponding to the black spot in the curve graph. As illustrated in the lower left graph in FIG. 5, when the external magnetic field H in a direction opposite to the pinning direction Q1 is applied to the vortex magnetoresistor 200, the round free layer 240 illustrated in FIG. 4D generates a net magnetization in the direction opposite to the pinning direction Q1, which causes the resistance value R to increase, i.e., the value of the resistance value R corresponding to the black spot in the curve graph. As illustrated in the upper right graph in FIG. 5, when the external magnetic field H in a direction perpendicular to the pinning direction Q1 is applied to the vortex magnetoresistor 200, the round free layer 240 illustrated in FIG. 4A or FIG. 4B generates a net magnetization in the direction perpendicular to the pinning direction Q1, and an orthographic projection amount of the net magnetization on the pinning direction Q1 is zero, which causes the resistance value R to remain unchanged, i.e., the value of the resistance value R corresponding to the black spot in the curve graph. Moreover, as illustrated in the lower right graph in FIG. 5, when no magnetic field is applied to the vortex magnetoresistor 200, the resistance value R remains unchanged, i.e., the value of the resistance value R corresponding to the black spot in the curve graph.

Moreover, in the states illustrated in FIG. 4A, FIG. 4B, FIG. 4C and FIG. 4D, the direction of each net magnetization of the round free layer 240 is inclined with respect to the pinning direction Q1, while in this circumstance, the variation of the resistance value R is determined by the orthographic projection of the net magnetization of the round free layer 240 on the pinning direction Q1. Thus, the resistance value R is respectively decreased, increased, decreased and increased in the states illustrated in FIG. 4A, FIG. 4B, FIG. 4C and FIG. 4D, that is, resistance variations, $-\Delta R$, $+\Delta R$, $-\Delta R$ and $+\Delta R$ are respectively generated.

Figure 6A:
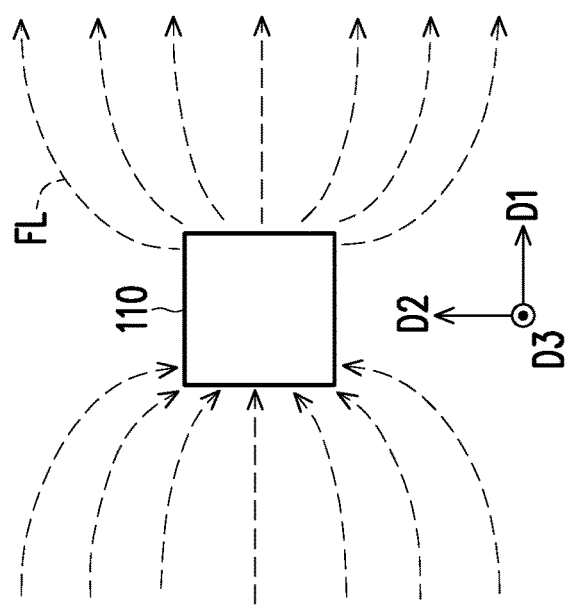
FIG. 6A, FIG. 6B and FIG. 6C respectively illustrate deflection states of magnetic flux lines in three different view angles when an external magnetic field along the first direction passes through near a magnetic flux concentrating module.
Figure 6C:
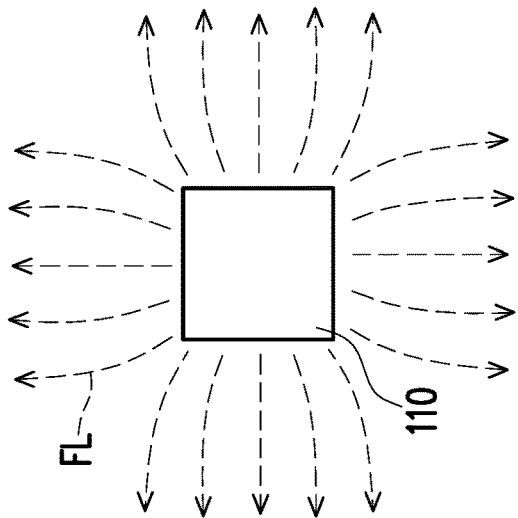
Figure 6B:
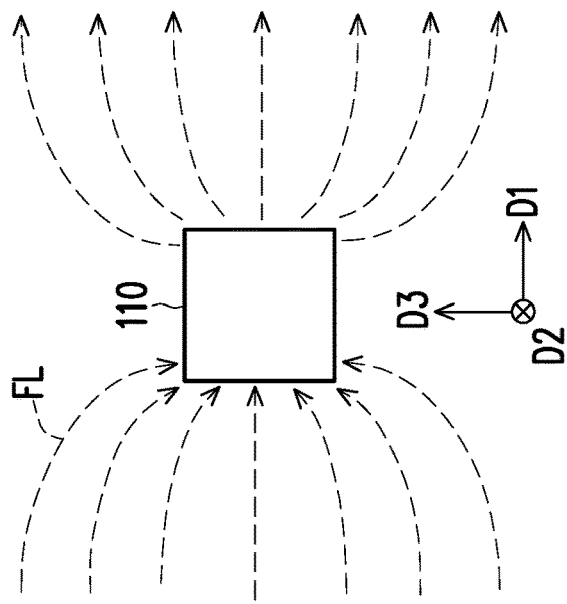
Figure 8B:
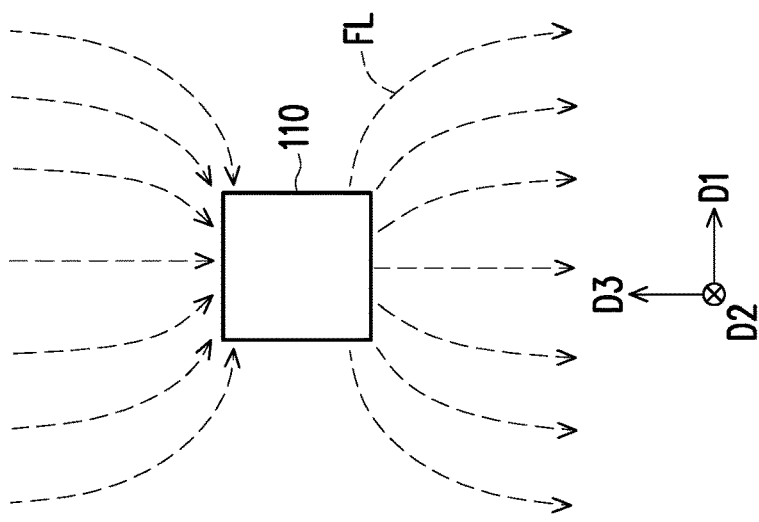
FIG. 8A, FIG. 8B and FIG. 8C respectively illustrate deflection states of the magnetic flux lines in three different view angles when an external magnetic field along the direction opposite to the third direction passes through near the magnetic flux concentrating module.
Figure 8C:
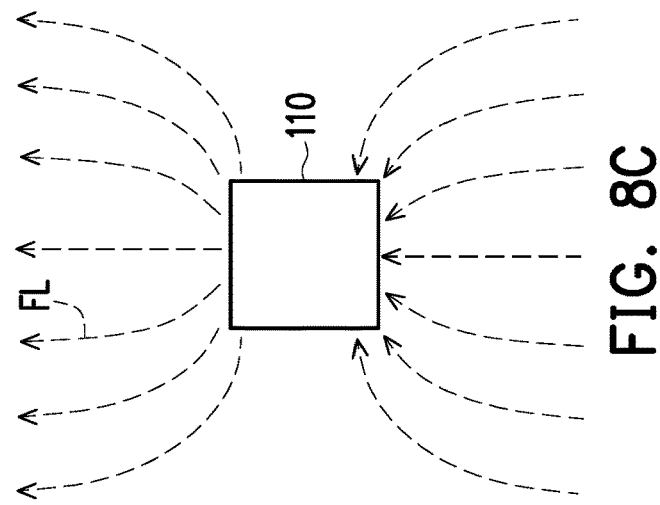
Figure 8A:
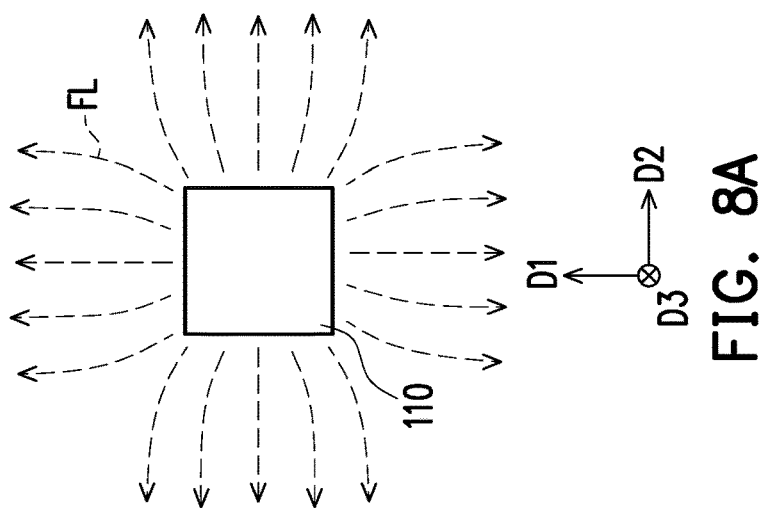

FIG. 6A, FIG. 6B and FIG. 6C respectively illustrate deflection states of magnetic flux lines FL in three different view angles when the external magnetic field along the first direction D1 passes through near the magnetic flux concentrating module 110. FIG. 7A, FIG. 7B and FIG. 7C respectively illustrate deflection states of the magnetic flux lines FL in three different view angles when an external magnetic field along the second direction D2 passes through near the magnetic flux concentrating module 110. FIG. 8A, FIG. 8B and FIG. 8C respectively illustrate deflection states of the magnetic flux lines FL in three different view angles when an external magnetic field along the direction opposite to the third direction D3 passes through near the magnetic flux concentrating module 110. It may be known according to FIG. 6A through FIG. 8C, a magnetic permeability of the magnetic flux concentrating module 110 is higher than a magnetic permeability of its surrounding environment, and thus, the magnetic flux concentrating module 110 has an attractive effect to the surrounding magnetic flux lines FL around it, such that a direction of the magnetic flux lines FL around it tends to be perpendicular to a surface of the magnetic flux concentrating module 110. FIG. 1B also illustrates a distribution status of the magnetic flux lines FL thereof around the magnetic flux concentrating module 110 and the vortex magnetoresistors 200 when the magnetic field sensing device 100 exists in the external magnetic field H along the direction opposite to the third direction D3.

Referring again to FIG. 1A, in the present embodiment, the vortex magnetoresistors 200 include a vortex magnetoresistor R1, a vortex magnetoresistor R2, a vortex magnetoresistor R3, a vortex magnetoresistor R4, a vortex magnetoresistor R5, a vortex magnetoresistor R6, a vortex magnetoresistor R7 and a vortex magnetoresistor R8. The vortex magnetoresistor R1 and the vortex magnetoresistor R2 are respectively disposed beside two opposite ends of the first side E1, the vortex magnetoresistor R3 and the vortex magnetoresistor R4 are respectively disposed beside two opposite ends of the third side E3, the vortex magnetoresistor R5 and the vortex magnetoresistor R6 are respectively disposed beside two opposite ends of the second side E2, and the vortex magnetoresistor R7 and the vortex magnetoresistor R8 are respectively disposed beside two opposite ends of the fourth side E4.

Figure 9A:
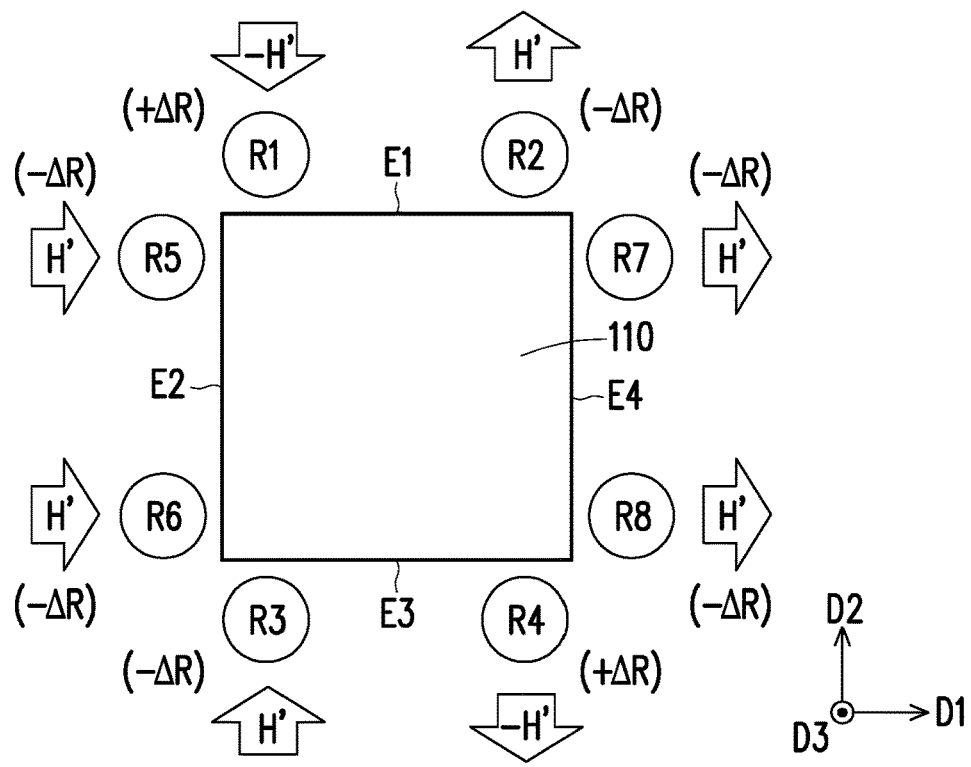
FIG. 9A illustrates the direction of the magnetic field component at each of the vortex magnetoresistors and the resistance variation generated to each of the vortex magnetoresistors when the external magnetic field along the first direction passes through the magnetic field sensing device depicted in FIG. 1A.
Figure 9B:
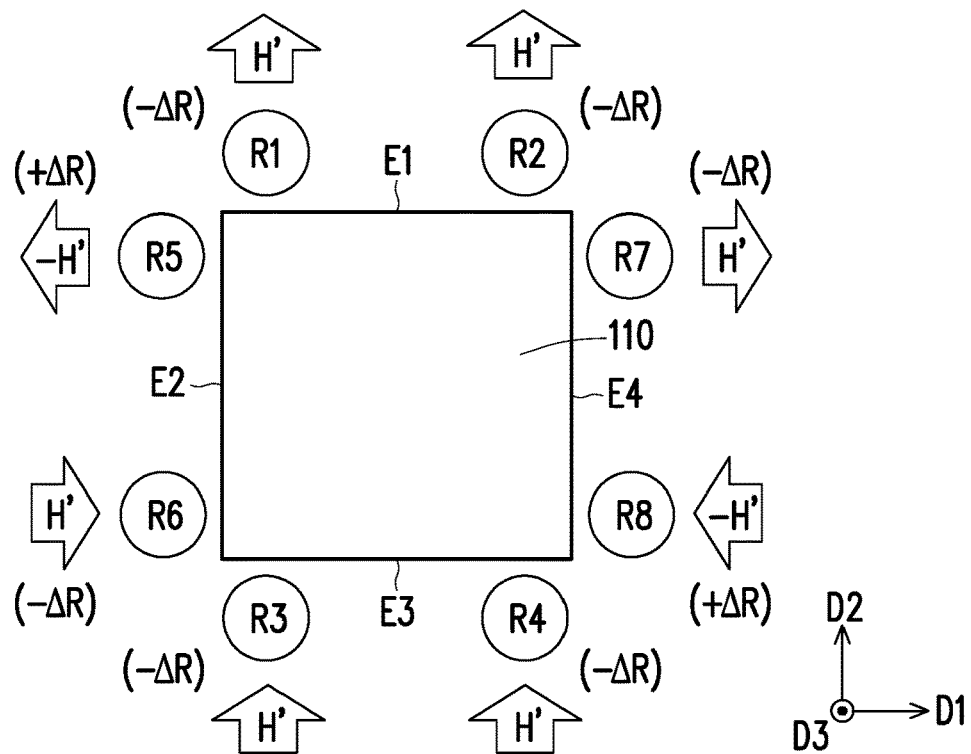
FIG. 9B illustrates the direction of the magnetic field component at each of the vortex magnetoresistors and the resistance variation generated to each of the vortex magnetoresistors when an external magnetic field along the second direction passes through the magnetic field sensing device depicted in FIG. 1A.
Figure 9C:
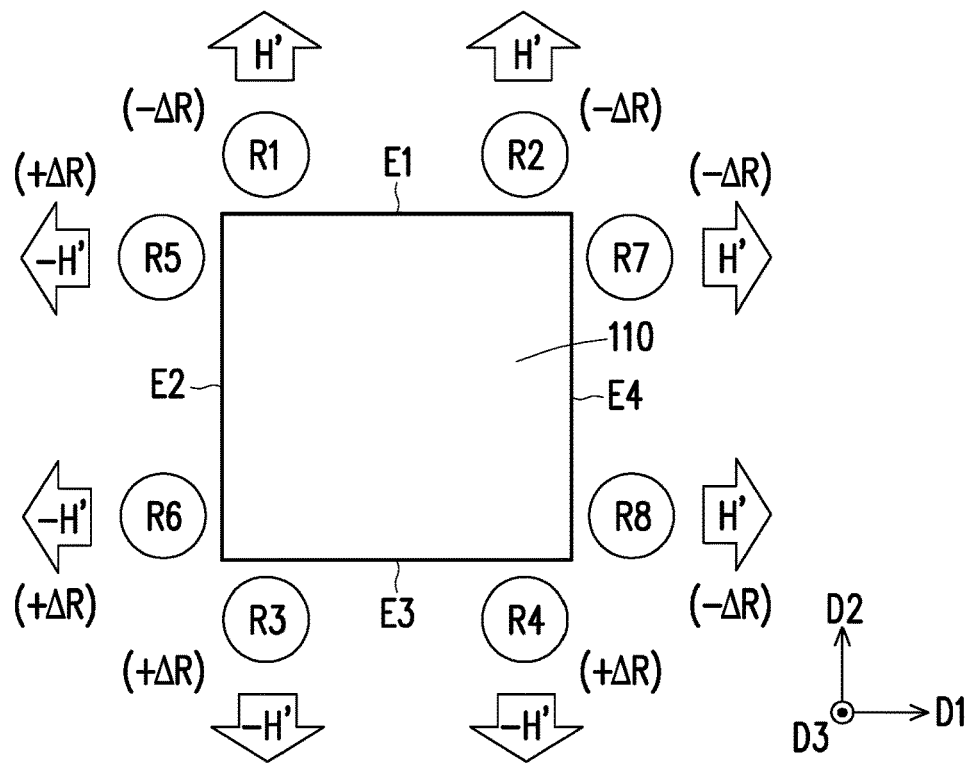
FIG. 9C illustrates the direction of the magnetic field component at each of the vortex magnetoresistors and the resistance variation generated to each of the vortex magnetoresistors when an external magnetic field along a direction opposite to the third direction passes through the magnetic field sensing device depicted in FIG. 1A.

FIG. 9A illustrates a direction of a magnetic field component (H' or −H') at each of the vortex magnetoresistors R1-R8 and the resistance variation (+ΔR or −ΔR) generated to each of the vortex magnetoresistors R1-R8 when the external magnetic field along the first direction D1 passes through the magnetic field sensing device 100 depicted in FIG. 1A. FIG. 9B illustrates the direction of the magnetic field component H' at each of the vortex magnetoresistors R1-R8 and the resistance variation (+ΔR or −ΔR) generated to each of the vortex magnetoresistors R1-R8 when the external magnetic field along the second direction D2 passes through the magnetic field sensing device 100 depicted in FIG. 1A. FIG. 9C illustrates the direction of the magnetic field component H' at each of the vortex magnetoresistors R1-R8 and the resistance variation (+ΔR or −ΔR) generated to each of the vortex magnetoresistors R1-R8 when the external magnetic field along the direction opposite to the third direction D3 passes through the magnetic field sensing device depicted in FIG. 1A. Referring first to FIG. 9A, when the external magnetic field H along the first direction D1 exists, after being influenced by the magnetic flux concentrating module 110, a magnetic field component −H' at the vortex magnetoresistor R1 is oriented to the direction opposite to the second direction D2, a magnetic field component H' at the vortex magnetoresistor R2 is oriented to the second direction D2, a magnetic field component H' at the vortex magnetoresistor R3 is oriented to the second direction D2, a magnetic field component −H' at the vortex magnetoresistor R4 is oriented to the direction opposite to the second direction D2, and a magnetic field component H' at each of the vortex magnetoresistors R5, R6, R7 and R8 is oriented to the first direction D1, such that resistance variations of the vortex magnetoresistors R1, R2, R3, R4, R5, R6, R7 and R8 are +ΔR, −ΔR, −ΔR, +ΔR, −ΔR, −ΔR, −ΔR and −ΔR, respectively. By deducing in the same way, referring to FIG. 9B, when the external magnetic field along the second direction D2 exists, the resistance variations of the vortex magnetoresistors R1, R2, R3, R4, R5, R6, R7 and R8 are −ΔR, −ΔR, −ΔR, −ΔR, +ΔR, −ΔR, −ΔR and +ΔR, respectively. In addition, when the external magnetic field along the direction opposite to the third direction D3 exists, the resistance variations of the vortex magnetoresistors R1, R2, R3, R4, R5, R6, R7 and R8 are −ΔR, −ΔR, +ΔR, +ΔR, +ΔR, +ΔR, −ΔR and −ΔR, respectively.

Figure 10A:
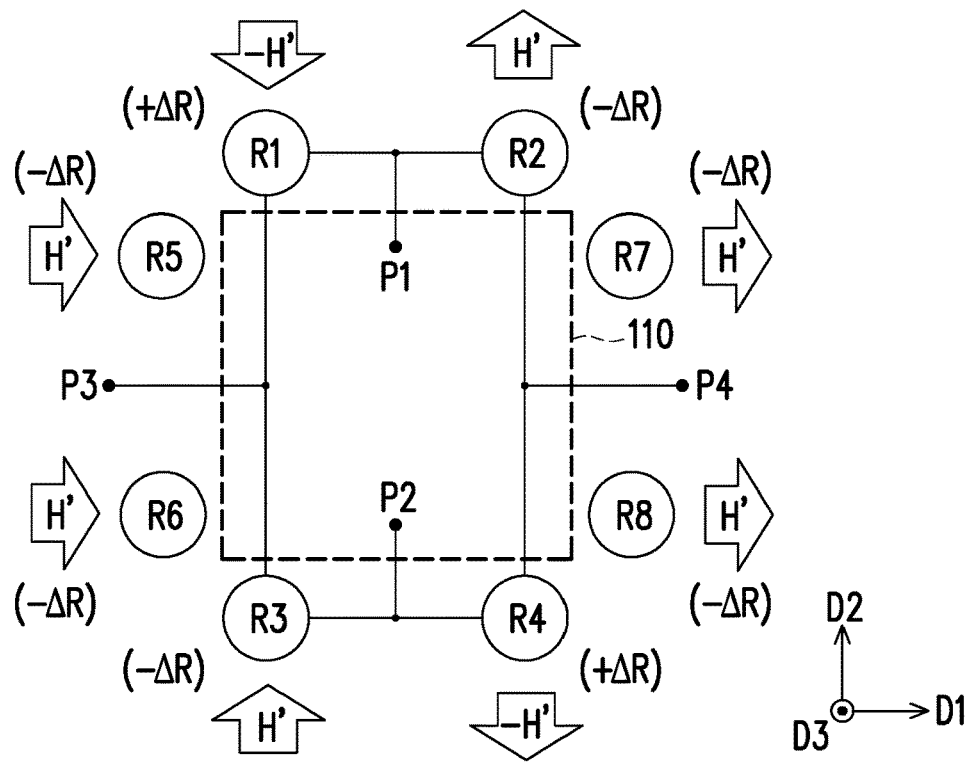
FIG. 10A, FIG. 10B and FIG. 10C illustrate three different Wheatstone bridges formed by the magnetic field sensing device depicted in FIG. 1A at different times.
Figure 10B:
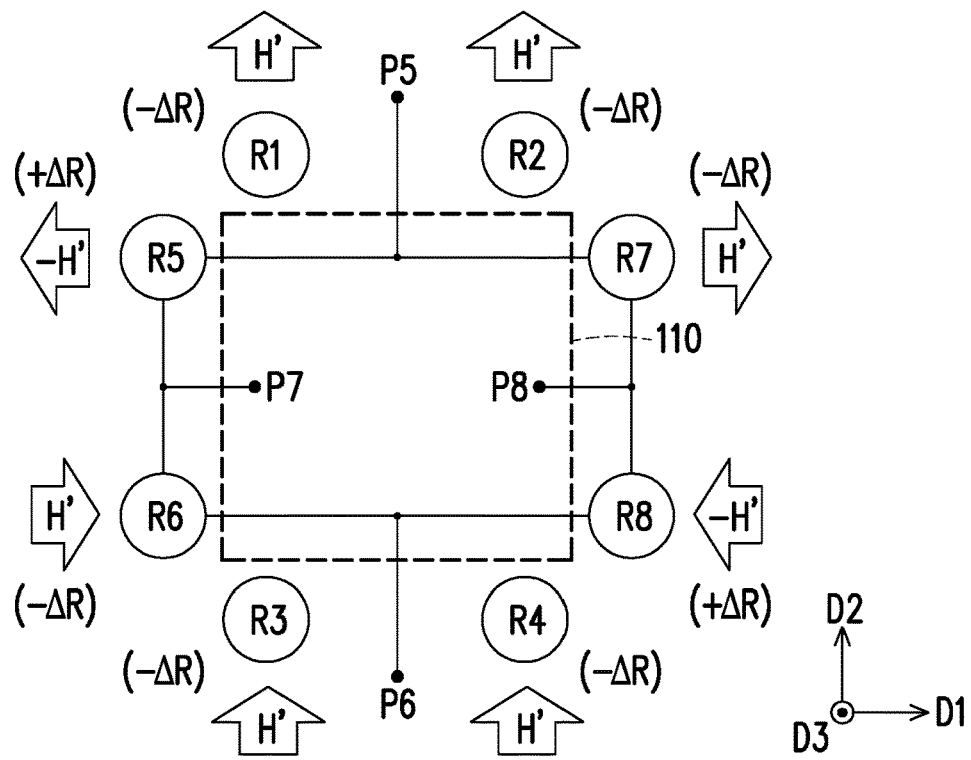
Figure 10C:
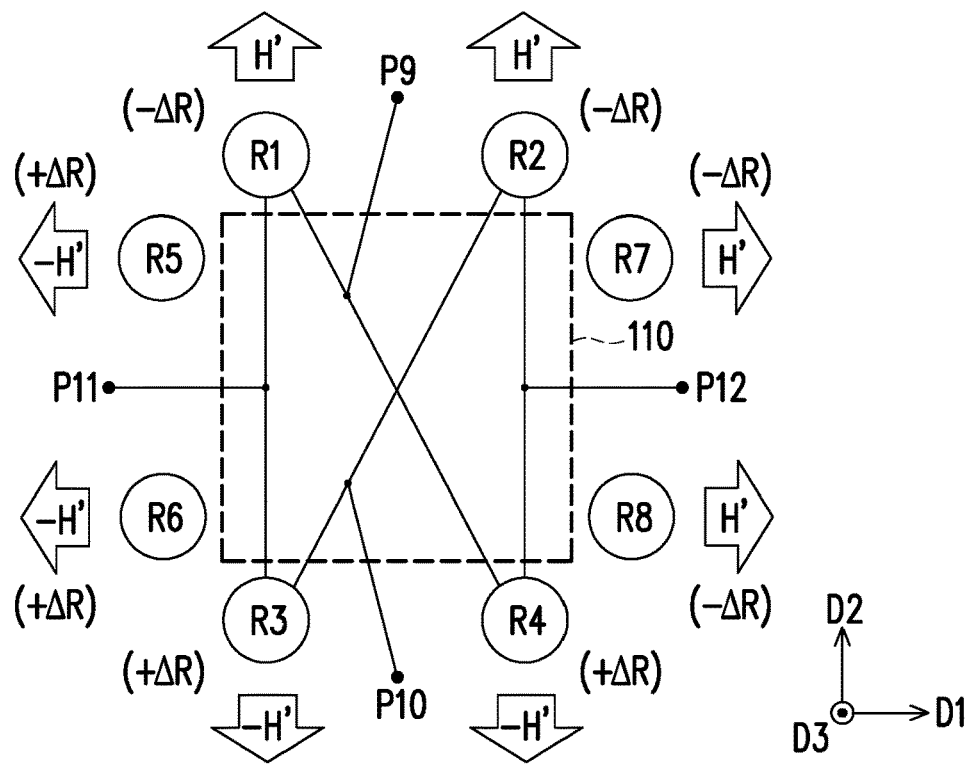

FIG. 10A, FIG. 10B and FIG. 10C illustrate three different Wheatstone bridges formed by the magnetic field sensing device depicted in FIG. 1A at different times, wherein the different Wheatstone bridges are used to sense magnetic field components in three directions, respectively. Referring to FIG. 1A, FIG. 1B, FIG. 10A, FIG. 10B and FIG. 10C, the magnetic field sensing device 100 further includes a switching circuit 120 electrically connected to the vortex magnetoresistors 200. The switching circuit 120 is adapted to switch a connection state of each of the vortex magnetoresistors 200 to three different Wheatstone bridges at three different times, so as to sense the magnetic field components in three different directions (e.g., the first direction D1, the second direction D2, and the direction opposite to the third direction D3), respectively. Specifically, referring to FIG. 10A, in a first time among the three different times, the vortex magnetoresistor R1 is electrically connected to the vortex magnetoresistor R2, the vortex magnetoresistor R2 is electrically connected to the vortex magnetoresistor R4, the vortex magnetoresistor R4 is electrically connected to the vortex magnetoresistor R3, the vortex magnetoresistor R3 is electrically connected to the vortex magnetoresistor R1, a contact point P1 is electrically connected to a conductive path between the vortex magnetoresistor R1 and the vortex magnetoresistor R2, a contact point P2 is electrically connected to a conductive path between the vortex magnetoresistor R3 and the vortex magnetoresistor R4, a contact point P3 is electrically connected to a conductive path between the vortex magnetoresistor R1 and the vortex magnetoresistor R3, and a contact point P4 is electrically connected to a conductive path between the vortex magnetoresistor R2 and the vortex magnetoresistor R4, such that a first Wheatstone bridge may be formed. In this circumstance, the contact point P1 may receive a reference voltage VDD, and the contact point P2 may be coupled to the ground, while in this circumstance, for the magnetic field component of the external magnetic field in the first direction D1, each of the vortex magnetoresistors 200 may form the resistance variation as illustrated in FIG. 9A and FIG. 10A, such that a voltage difference between the contact points P3 and P4 may be (VDD)×(−ΔR/R), which may be an output signal, and this output signal is a differential signal with a size corresponding to a size of a magnetic field component of the external magnetic field in the first direction D1. In this circumstance, a magnetic field component of the external magnetic field in the second direction D2 and a magnetic field component of the external magnetic field in the direction opposite to the third direction D3 respectively induce each of the vortex magnetoresistors 200 to form the resistance variations as illustrated in FIG. 9B and FIG. 9C, and the resistance variations as illustrated in FIG. 9B and FIG. 9C contribute nothing to the voltage difference between the contact points P3 and P4 of the first Wheatstone bridge. Thus, the first Wheatstone bridge may be dedicated to measure the magnetic field component in the first direction D1, without being interfered by the magnetic field components in the second direction D2 and the third direction D3.

Referring again to FIG. 10B, in a second time among the three different times, the vortex magnetoresistor R5 is electrically connected to the vortex magnetoresistor R7, the vortex magnetoresistor R7 is electrically connected to the vortex magnetoresistor R8, the vortex magnetoresistor R8 is electrically connected to the vortex magnetoresistor R6, the vortex magnetoresistor R6 is electrically connected to the vortex magnetoresistor R5, a contact point P5 is electrically connected to a conductive path between the vortex magnetoresistor R5 and the vortex magnetoresistor R7, a contact point P6 is electrically connected to a conductive path between the vortex magnetoresistor R6 and the vortex magnetoresistor R8, a contact point P7 is electrically connected to a conductive path between the vortex magnetoresistor R5 and the vortex magnetoresistor R6, and a contact point P8 is electrically connected to a conductive path between the vortex magnetoresistor R7 and the vortex magnetoresistor R8, such that a second Wheatstone bridge may be formed. In this circumstance, the contact point P5 may receive the reference voltage VDD, and the contact point P6 may be coupled to the ground, while in this circumstance, for the magnetic field component of the external magnetic field in the second direction D2, each of the vortex magnetoresistors 200 may form the resistance variation as illustrated in FIG. 9B and FIG. 10B, such that a voltage difference between the contact points P7 and P8 may be (VDD)×(−ΔR/R), which may be an output signal, and this output signal is a differential signal with a size corresponding to a size of the magnetic field component of the external magnetic field in the second direction D2. In this circumstance, the magnetic field component of the external magnetic field in the first direction D1 and the magnetic field component of the external magnetic field in the direction opposite to the third direction D3 induce each of the vortex magnetoresistors 200 to form the resistance variation as illustrated in FIG. 9A and FIG. 9C, and the resistance variation as illustrated in FIG. 9A and FIG. 9C contributes nothing to the voltage difference between the contact points P7 and P8 of the second Wheatstone bridge. Thus, the second Wheatstone bridge may be dedicated to measure the magnetic field component in the second direction D2, without being interfered by the magnetic field components in the first direction D1 and the third direction D3.

Referring again to FIG. 10C, in a third time among the three different times, the vortex magnetoresistor R1 is electrically connected to the vortex magnetoresistor R4, the vortex magnetoresistor R4 is electrically connected to the vortex magnetoresistor R2, the vortex magnetoresistor R2 is electrically connected to the vortex magnetoresistor R3, the vortex magnetoresistor R3 is electrically connected to the vortex magnetoresistor R1, a contact point P9 is electrically connected to a conductive path between the vortex magnetoresistor R1 and the vortex magnetoresistor R4, a contact point P10 is electrically connected to a conductive path between the vortex magnetoresistor R2 and the vortex magnetoresistor R3, a contact point P11 is electrically connected to the conductive path between the vortex magnetoresistor R1 and the vortex magnetoresistor R3, and a contact point P12 is electrically connected to the conductive path between the vortex magnetoresistor R2 and the vortex magnetoresistor R4, such that a third Wheatstone bridge may be formed. In this circumstance, the contact point P9 may receive the reference voltage VDD, and the contact point P10 may be coupled to the ground, while in this circumstance, for the magnetic field component of the external magnetic field in the direction opposite to the third direction D3, each of the vortex magnetoresistors 200 may form the resistance variation as illustrated in FIG. 9C and FIG. 10C, such that a voltage difference between the contact points P11 and P12 may be (VDD)×(ΔR/R), which may be an output signal, and this output signal is a differential signal with a size corresponding to a size of the magnetic field component of the external magnetic field in the direction opposite to the third direction D3. In this circumstance, the magnetic field component of the external magnetic field in the first direction D1 and the magnetic field component of the external magnetic field in the second direction D2 induce each of the vortex magnetoresistors 200 to form the resistance variations as illustrated in FIG. 9A and FIG. 9B, and the resistance variations as illustrated in FIG. 9A and FIG. 9B contribute nothing to the voltage difference between the contact points P11 and P12 of the third Wheatstone bridge. Thus, the third Wheatstone bridge may be dedicated to measure the magnetic field component in the direction opposite to the third direction D3, without being interfered by the magnetic field components in the first direction D1 and the second direction D2.

In this way, when the first time, the second time and the third time continuously take place in turn, that is, the switching circuit 120 continuously switches the vortex magnetoresistors 200 to the first, the second and the third Wheatstone bridges in turn, the magnetic field sensing device 100 is capable of instantly sensing the size and the direction of the external magnetic field in an arbitrary direction in a three-dimensional (3D) space.

Figure 10D:
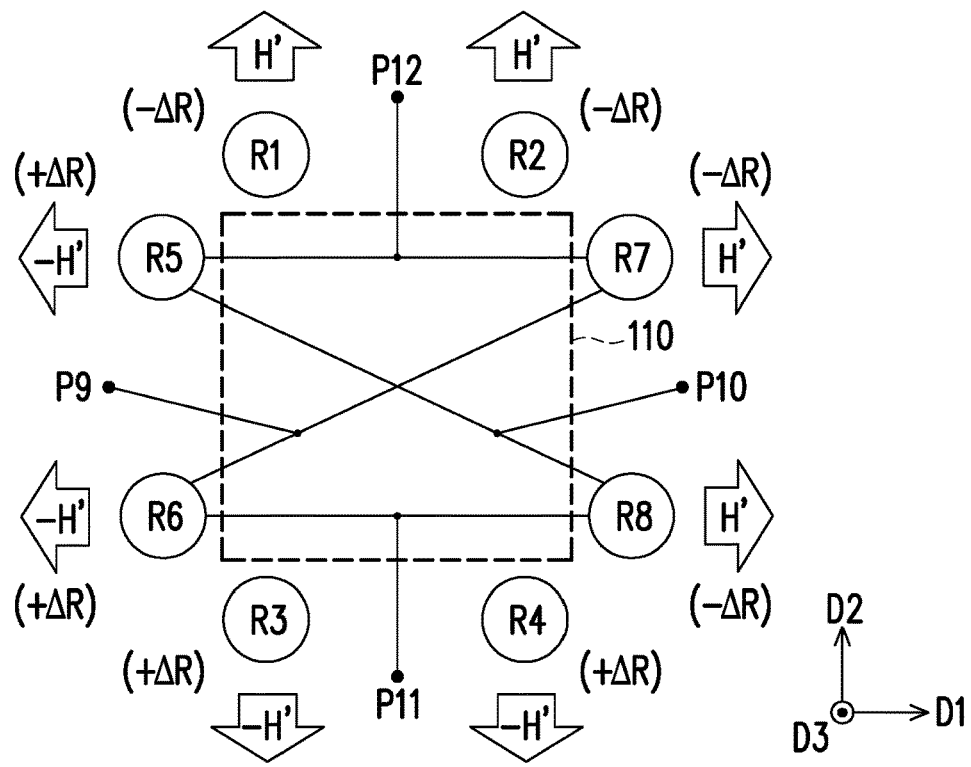
FIG. 10D and FIG. 10E illustrate another two variation types of the third Wheatstone bridge depicted in FIG. 10C.
Figure 10E:
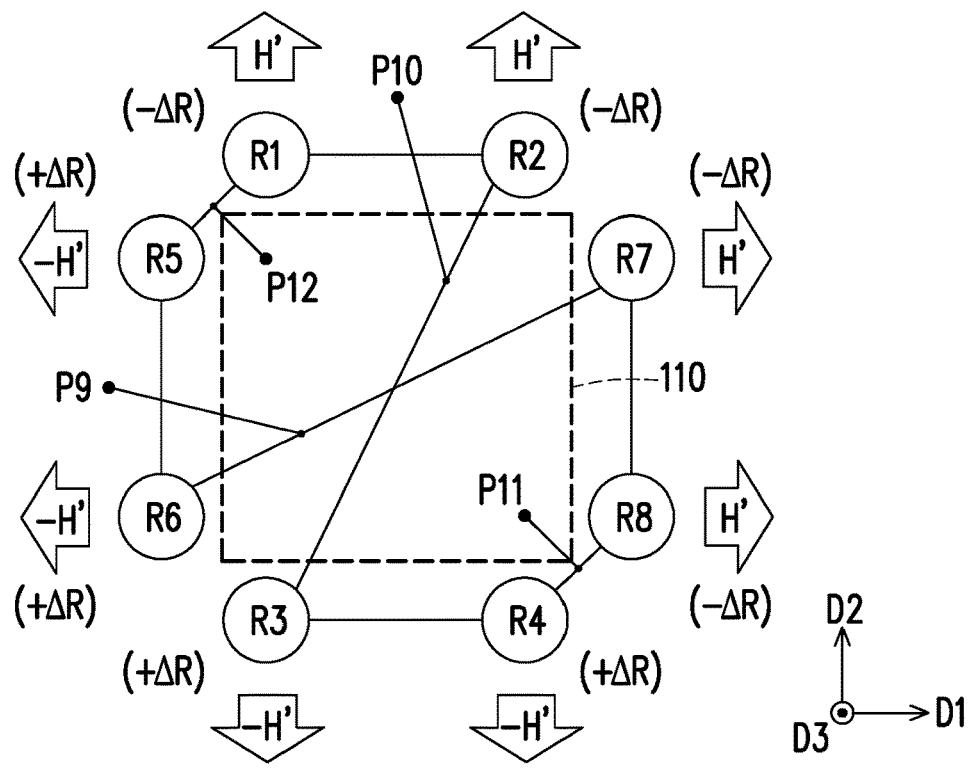

FIG. 10D and FIG. 10E illustrate another two variation types of the third Wheatstone bridge depicted in FIG. 10C. Referring first to FIG. 10D, in the third time among the three different times, the vortex magnetoresistor R5 is electrically connected to the vortex magnetoresistor R7, the vortex magnetoresistor R7 is electrically connected to the vortex magnetoresistor R6, the vortex magnetoresistor R6 is electrically connected to the vortex magnetoresistor R8, the vortex magnetoresistor R8 is electrically connected to the vortex magnetoresistor R5, the contact point P9 is electrically connected to a conductive path between the vortex magnetoresistor R6 and the vortex magnetoresistor R7, the contact point P10 is electrically connected to the conductive path between the vortex magnetoresistor R5 and the vortex magnetoresistor R8, the contact point P11 is electrically connected to the conductive path between the vortex magnetoresistor R6 and the vortex magnetoresistor R8, and the contact point P12 is electrically connected to the conductive path between the vortex magnetoresistor R5 and the vortex magnetoresistor R7, such that a third Wheatstone bridge may be formed. In this circumstance, the contact point P9 may receive the reference voltage VDD, and the contact point P10 may be coupled to the ground, while in this circumstance, for the magnetic field component of the external magnetic field in the direction opposite to the third direction D3, each of the vortex magnetoresistors 200 may form the resistance variation as illustrated in FIG. 9C and FIG. 10D, such that the voltage difference between the contact points P11 and P12 may be (VDD)×(−ΔR/R), which may be an output signal, and this output signal is a differential signal with a size corresponding to the size of the magnetic field component of the external magnetic field in the direction opposite to the third direction D3. In this circumstance, the magnetic field component of the external magnetic field in the first direction D1 and the magnetic field component of the external magnetic field in the second direction D2 induce each of the vortex magnetoresistors 200 to form the resistance variations as illustrated in FIG. 9A and FIG. 9B, and the resistance variations as illustrated in FIG. 9A and FIG. 9B contribute nothing to the voltage difference between the contact points P11 and P12 of the third Wheatstone bridge. Thus, the third Wheatstone bridge may be dedicated to measure the magnetic field component in the direction opposite to the third direction D3, without being interfered by the magnetic field components in the first direction D1 and the second direction D2.

Referring first to FIG. 10E, in the third time among the three different times, the vortex magnetoresistor R1 is electrically connected to the vortex magnetoresistor R2, the vortex magnetoresistor R2 is electrically connected to the vortex magnetoresistor R3, the vortex magnetoresistor R3 is electrically connected to the vortex magnetoresistor R4, the vortex magnetoresistor R4 is electrically connected to the vortex magnetoresistor R8, the vortex magnetoresistor R8 is electrically connected to the vortex magnetoresistor R7, the vortex magnetoresistor R7 is electrically connected to the vortex magnetoresistor R6, the vortex magnetoresistor R6 is electrically connected to the vortex magnetoresistor R5, the vortex magnetoresistor R5 is electrically connected to the vortex magnetoresistor R1, the contact point P9 is electrically connected to the conductive path between the vortex magnetoresistor R6 and the vortex magnetoresistor R7, the contact point P10 is electrically connected to the conductive path between the vortex magnetoresistor R2 and the vortex magnetoresistor R3, the contact point P11 is electrically connected to a conductive path between the vortex magnetoresistor R4 and the vortex magnetoresistor R8, and the contact point P12 is electrically connected to a conductive path between the vortex magnetoresistor R5 and the vortex magnetoresistor R1, such that a third Wheatstone bridge may be formed. In this circumstance, the contact point P9 may receive the reference voltage VDD, and the contact point P10 may be coupled to the ground, while in this circumstance, for the magnetic field component of the external magnetic field in the direction opposite to the third direction D3, each of the vortex magnetoresistors 200 may form the resistance variation as illustrated in FIG. 9C and FIG. 10E, such that the voltage difference between the contact points P11 and P12 may be (VDD)×(ΔR/R), which may be an output signal, and this output signal is a differential signal with a size corresponding to the size of the magnetic field component of the external magnetic field in the direction opposite to the third direction D3. In this circumstance, the magnetic field component of the external magnetic field in the first direction D1 and the magnetic field component of the external magnetic field in the second direction D2 induce each of the vortex magnetoresistors 200 to form the resistance variations as illustrated in FIG. 9A and FIG. 9B, and the resistance variations as illustrated in FIG. 9A and FIG. 9B contribute nothing to the voltage difference between the contact points P11 and P12 of the third Wheatstone bridge. Thus, the third Wheatstone bridge may be dedicated to measure the magnetic field component in the direction opposite to the third direction D3, without being interfered by the magnetic field components in the first direction D1 and the second direction D2.

Figure 11:
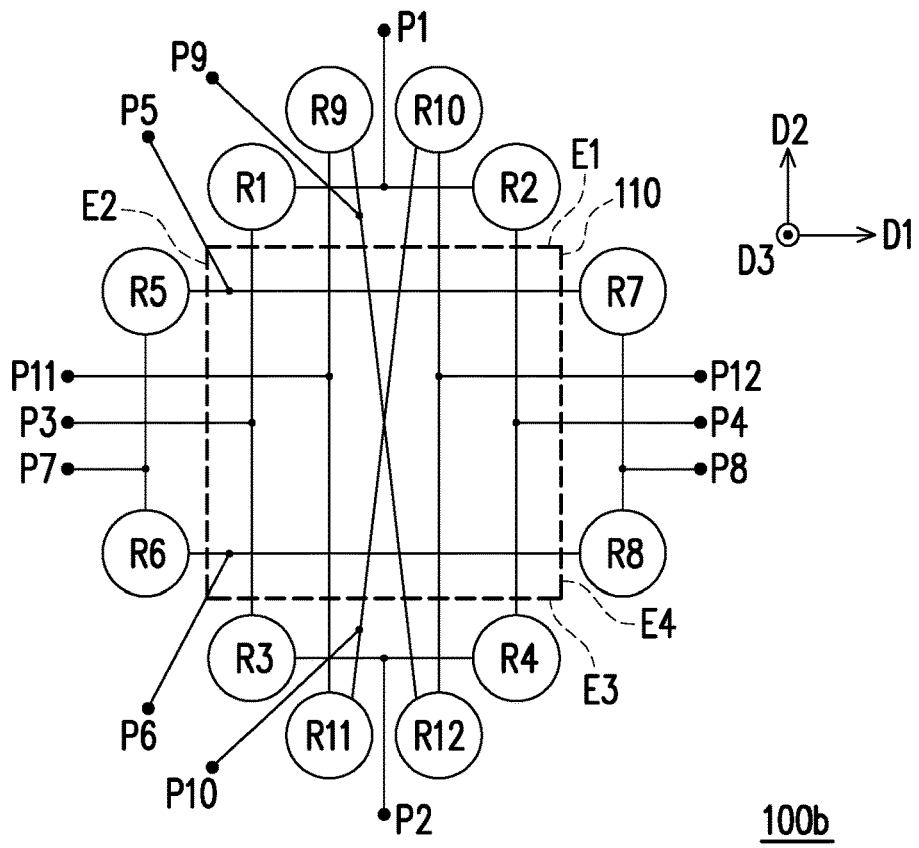
FIG. 11 is a schematic top-view diagram illustrating a magnetic field sensing device according to another embodiment of the invention.

FIG. 11 is a schematic top-view diagram illustrating a magnetic field sensing device according to another embodiment of the invention. Referring to FIG. 11, a magnetic field sensing device 100b of the present embodiment is similar to the magnetic field sensing device 100 illustrated in FIG. 1A and FIG. 1B, and the difference therebetween will be described below. The magnetic field sensing device 100b of the present embodiment is not switched among the three different Wheatstone bridges at three different times via the switching circuit 120, the switching circuit 120 does not exist, and three different Wheatstone bridges may simultaneously exists and be fixedly connected to. A first Wheatstone bridge in the magnetic field sensing device 100b (i.e., a Wheatstone bridge connecting the vortex magnetoresistors R1, R2, R4 and R3) and a second Wheatstone bridge (i.e., a Wheatstone bridge connecting the vortex magnetoresistors R5, R7, R8 and R6) of the present embodiment are respectively the same as the Wheatstone bridge illustrated in FIG. 10A and the Wheatstone bridge illustrated in FIG. 10B, but the first Wheatstone bridge and the second Wheatstone bridge of the present embodiment are fixed and simultaneously exist. Additionally, in the present embodiment, the magnetic field sensing device 100b further includes a vortex magnetoresistor R9, a vortex magnetoresistor R10, a vortex magnetoresistor R11 and a vortex magnetoresistor R12. The vortex magnetoresistor R9 and the vortex magnetoresistor R10 are respectively disposed beside a middle section of the first side E1, and the vortex magnetoresistor R11 and the vortex magnetoresistor R12 are respectively disposed beside a middle section of the third side E3. The vortex magnetoresistors R1-R4 are connected to form the first Wheatstone bridge to sense a magnetic field component of an external magnetic field in a direction parallel to the first side E1 (i.e., the magnetic field component in the first direction D1), the vortex magnetoresistors R5-R8 are connected to form the second Wheatstone bridge to sense a magnetic field component of the external magnetic field in a direction parallel to the second side E2 (i.e., the magnetic field component in the first direction D2), and the vortex magnetoresistors R9 to R10 are connected to form the third Wheatstone bridge to sense a magnetic field component of the external magnetic field in the direction perpendicular to the plane constituted by the first side E1 and the second side E2 (i.e., the magnetic field component in the direction opposite to the third direction D3). The third Wheatstone bridge of the present embodiment is the same as the Wheatstone bridge illustrated in FIG. 10C, but only the vortex magnetoresistors R1, R2, R3 and R4 are respectively replaced by the vortex magnetoresistors R9, R10, R11 and R12. In addition, reactions the vortex magnetoresistors R9, R10, R11 and R12 to the magnetic field component in each direction is similar to that of the vortex magnetoresistors R1, R2, R3 and R4 and will not be repeatedly described herein after.

Figure 12:
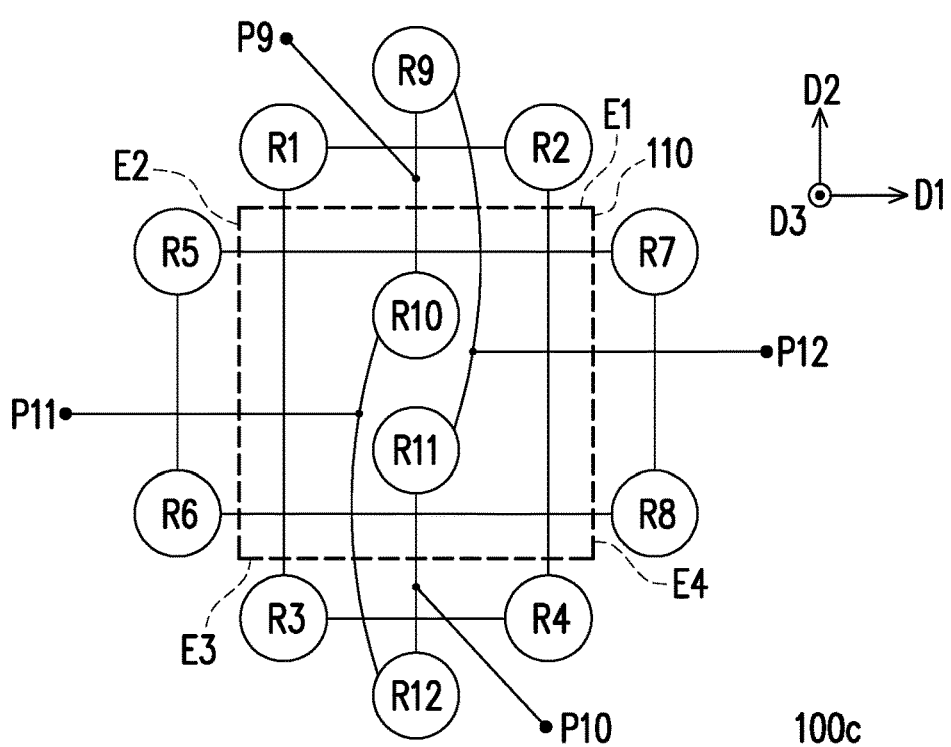
FIG. 12 is a schematic top-view diagram illustrating a magnetic field sensing device according to yet another embodiment of the invention.

FIG. 12 is a schematic top-view diagram illustrating a magnetic field sensing device according to yet another embodiment of the invention. Referring to FIG. 12, a magnetic field sensing device 100c of the present embodiment is similar to the magnetic field sensing device 100b illustrated in FIG. 11, and the difference therebetween will be described below. In the present embodiment, the vortex magnetoresistor R9 is disposed beside the middle section of the first side E1, the vortex magnetoresistors R10 and R11 are disposed below the magnetic flux concentrating module 110 (i.e., disposed at a side of the magnetic flux concentrating module 110 in the direction opposite to the third direction D3), for example, disposed between the magnetic flux concentrating module 110 and the substrate 130. In addition, the vortex magnetoresistor R12 is disposed beside the middle section of the third side E3, and due to a shielding effect by the magnetic flux concentrating module 110, the magnetic field component of the external magnetic field in the first direction D1 and the magnetic field component in the second direction D2 hardly generate any magnetic field component at the vortex magnetoresistors R10 and R11, while the magnetic field component of the external magnetic field in the direction opposite to the third direction D3 is perpendicular to each film surface of each of the vortex magnetoresistors R10 and R11, and thus, the vortex magnetoresistors R10 and R11 are also incapable of sensing the magnetic field component in the third direction D3. In other words, the vortex magnetoresistors R10 and R11 may be considered as two dummy magnetoresistors, that is, resistance values thereof are not changed.

Thus, in the present embodiment, the vortex magnetoresistor R9 is electrically connected to the vortex magnetoresistor R10, the vortex magnetoresistor R10 is electrically connected to the vortex magnetoresistor R12, the vortex magnetoresistor R12 is electrically connected to the vortex magnetoresistor R11, the vortex magnetoresistor R11 is electrically connected to the vortex magnetoresistor R9, the contact point P9 is electrically connected to a conductive path between the vortex magnetoresistor R9 and the vortex magnetoresistor R10, the contact point P10 is electrically connected to a conductive path between the vortex magnetoresistor R11 and the vortex magnetoresistor R12, the contact point P11 is electrically connected to a conductive path between the vortex magnetoresistor R10 and the vortex magnetoresistor R12, and the contact point P12 is electrically connected to a conductive path between the vortex magnetoresistor R9 and the vortex magnetoresistor R11. In this way, the contact point P9 may receive the reference voltage VDD, and the contact point P10 may be coupled to the ground, such that the voltage difference between the contact points P11 and P12 may be an output signal, and this output signal is a differential signal with a size corresponding to the size of the magnetic field component of the external magnetic field in the direction opposite to the third direction D3.

In FIG. 12, the contact points P1-P4 of the first Wheatstone bridge connecting the vortex magnetoresistors R1-R4 and the contact points P5-P8 of the second Wheatstone bridge connecting the vortex magnetoresistors R5-R8 are respectively the same as the contact points P1-P4 of the first Wheatstone bridge and the contact points P5-P8 of the second Wheatstone bridge illustrated in FIG. 11 and thus, are omitted from FIG. 12.

Figure 13:
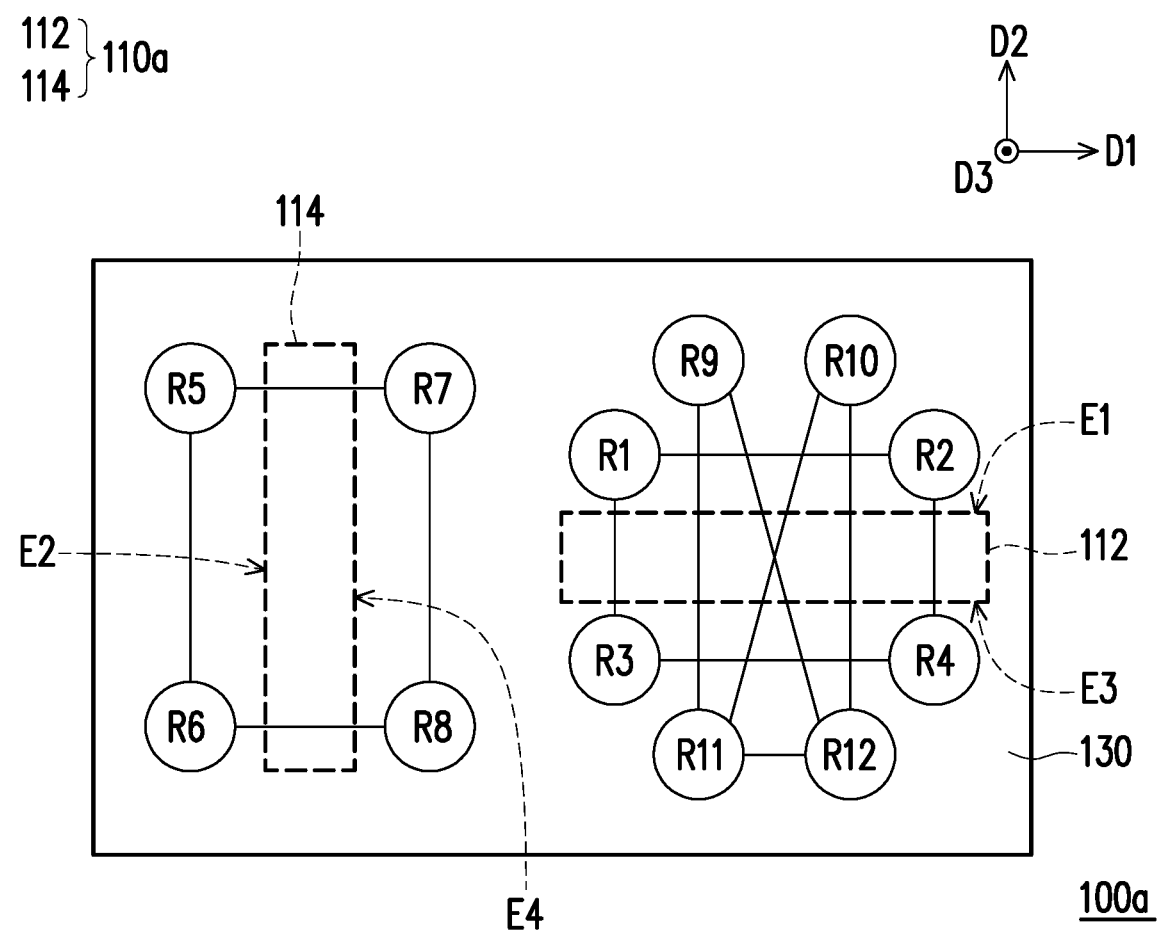
FIG. 13 is a schematic top-view diagram illustrating a magnetic field sensing device according to still another embodiment of the invention.

FIG. 13 is a schematic top-view diagram illustrating a magnetic field sensing device according to still another embodiment of the invention. Referring to FIG. 13, a magnetic field sensing device 100a of the present embodiment is similar to the magnetic field sensing device 100b illustrated in FIG. 11, and the difference therebetween will be described below. In the magnetic field sensing device 100a of the present embodiment, a magnetic flux concentrating module 110a includes a first magnetic flux concentrator 112 and a second magnetic flux concentrator 114 which are separated from each other. The first side E1 and the third side E3 are two opposite sides of the first magnetic flux concentrator 112, and the second side E2 and the fourth side E4 are two opposite sides of the second magnetic flux concentrator 114. In the present embodiment, the shapes of the first magnetic flux concentrator 112 and the second magnetic flux concentrator 114 are, for example, quadrangular columns, wherein the first side E1 and the third side E3 are, for example, two long sides of the first magnetic flux concentrator 112, and the second side E2 and the fourth side E4 are, for example, two long sides of the second magnetic flux concentrator 114, but the invention is not limited thereto. A relative relation between the vortex magnetoresistors R1-R12 and the first to the fourth sides E1-E4 are the same as that illustrated in FIG. 11 and will not be repeatedly described herein after. Moreover, the first Wheatstone bridge formed by connecting the vortex magnetoresistors R1-R4, the second Wheatstone bridge formed by connecting the vortex magnetoresistors R5-R8 and the third Wheatstone bridge formed by connecting the vortex magnetoresistors R9-R12 are respectively the same as the first to the third Wheatstone bridges illustrated in FIG. 11, and their reactions to the magnetic field components in various directions are also similar to those illustrated in FIG. 11 and will not be repeatedly described herein after.

Based on the above, in the magnetic field sensing device provided by the embodiments of the invention, the direction of the magnetic field is changed by using the magnetic flux concentrating module, and the pinning direction of the vortex magnetoresistors is inclined with respect to the sides of the magnetic flux concentrating module. Thus, the sensing of the magnetic field components in different directions can be achieved by using the vortex magnetoresistors having the same pinning direction. In this way, the magnetic field sensing device provided by the embodiments of the invention has a simple and stable manufacturing process and lower manufacturing cost, and thereby, the magnetization state of the vortex magnetoresistors can be more stable.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A magnetic field sensing device, comprising:
  a magnetic flux concentrating module, having a first side, a second side, a third side and a fourth side, wherein the first side is parallel to the third side, the second side is parallel to the fourth side, and the first side is not parallel to the second side; and
  a plurality of vortex magnetoresistors, disposed beside the first to the fourth sides, wherein the vortex magnetoresistors have a same pinning direction, the pinning direction is inclined with respect to the first side and with respect to the second side, the vortex magnetoresistors are configured to be connected to form a plurality of different Wheatstone bridges, so as to sense magnetic field components in a plurality of different directions, respectively.

2. The magnetic field sensing device according to claim 1, wherein an included angle between the pinning direction and the first side falls within a range from 10 degrees to 80 degrees, and an included angle between the pinning direction and the second side falls within a range from 10 degrees to 80 degrees.

3. The magnetic field sensing device according to claim 1, wherein the pinning direction is parallel to a plane constituted by the first side and the second side.

4. The magnetic field sensing device according to claim 1, wherein the first side is perpendicular to the second side.

5. The magnetic field sensing device according to claim 1, wherein the vortex magnetoresistors comprise:
  a first vortex magnetoresistor and a second vortex magnetoresistor, respectively disposed beside two opposite ends of the first side;
  a third vortex magnetoresistor and a fourth vortex magnetoresistor, respectively disposed beside two opposite ends of the third side;
  a fifth vortex magnetoresistor and a sixth vortex magnetoresistor, respectively disposed beside two opposite ends of the second side; and
  a seventh vortex magnetoresistor and an eighth vortex magnetoresistor, respectively disposed beside two opposite ends of the forth side.

6. The magnetic field sensing device according to claim 5, further comprising a switching circuit, electrically connected to the vortex magnetoresistors, wherein the switching circuit is configured to switch a connection state of the vortex magnetoresistors to three Wheatstone bridges at three different times, so as to sense the magnetic field components in three different directions, respectively.

7. The magnetic field sensing device according to claim 5, further comprising:
   a ninth vortex magnetoresistor and a tenth vortex magnetoresistor, disposed beside a middle section of the first side; and
   an eleventh vortex magnetoresistor and a twelfth vortex magnetoresistor, disposed beside a middle section of the third side, wherein the first, the second, the third and the fourth vortex magnetoresistors are connected to form a first Wheatstone bridge to sense a magnetic field component in a direction parallel to the first side, the fifth, the sixth, the seventh and the eighth vortex magnetoresistors are connected to form a second Wheatstone bridge to sense a magnetic field component in a direction parallel to the second side, and the ninth, the tenth, the eleventh and the twelfth vortex magnetoresistors are connected to form a third Wheatstone bridge to sense a magnetic field component in a direction perpendicular to the plane constituted by the first side and the second side.

8. The magnetic field sensing device according to claim 5, further comprising:
   a ninth vortex magnetoresistor, disposed beside a middle section of the first side;
   a tenth vortex magnetoresistor and an eleventh vortex magnetoresistor, disposed below the magnetic flux concentrating module; and
   a twelfth vortex magnetoresistor, disposed beside a middle section of the third side, wherein the first, the second, the third and the fourth vortex magnetoresistors are connected to form a first Wheatstone bridge to sense a magnetic field component in a direction parallel to the first side; the fifth, the sixth, the seventh and the eighth vortex magnetoresistors are connected to form a second Wheatstone bridge to sense a magnetic field component in a direction parallel to the second side; and the ninth, the tenth, the eleventh and the twelfth vortex magnetoresistors are connected to form a third Wheatstone bridge to sense a magnetic field component in a direction perpendicular to the plane constituted by the first side and the second side.

9. The magnetic field sensing device according to claim 1, wherein the magnetic flux concentrating module comprises a magnetic flux concentrator, and the first, the second, the third and the fourth sides are four sides of the magnetic flux concentrator.

10. The magnetic field sensing device according to claim 1, wherein the magnetic flux concentrating module comprises a first magnetic flux concentrator and a second magnetic flux concentrator which are separated from each other, the first side and the third side are two opposite sides of the first magnetic flux concentrator, and the second side and the fourth side are two opposite sides of the second magnetic flux concentrator.

11. The magnetic field sensing device according to claim 1, further comprising:
   a substrate, wherein the magnetic flux concentrating module and the vortex magnetoresistors are all disposed on the substrate.

12. The magnetic field sensing device according to claim 11, wherein each of the vortex magnetoresistors comprises:
   a pinning layer, disposed on the substrate;
   a pinned layer, disposed on the pinning layer;
   a spacer layer, disposed on the pinned layer; and
   a round free layer, disposed on the spacer layer and having a magnetization direction distribution in a vortex shape, wherein the spacer layer is a non-magnetic metal layer, and the vortex magnetoresistor is a giant magnetoresistor.

13. The magnetic field sensing device according to claim 11, wherein each of the vortex magnetoresistors comprises:
   a pinning layer, disposed on the substrate;
   a pinned layer, disposed on the pinning layer;
   a spacer layer, disposed on the pinned layer; and
   a round free layer, disposed on the spacer layer and having a magnetization direction distribution in a vortex shape, wherein the spacer layer is an insulation layer, and the vortex magnetoresistor is a tunneling magnetoresistor.

* * * * *